United States Patent
Li et al.

(10) Patent No.: US 10,795,586 B2
(45) Date of Patent: Oct. 6, 2020

(54) SYSTEM AND METHOD FOR OPTIMIZATION OF GLOBAL DATA PLACEMENT TO MITIGATE WEAR-OUT OF WRITE CACHE AND NAND FLASH

(71) Applicant: Alibaba Group Holding Limited, George Town, Grand Cayman (KY)

(72) Inventors: Shu Li, Bothell, WA (US); Ping Zhou, Folsom, CA (US)

(73) Assignee: Alibaba Group Holding Limited, George Town (KY)

( * ) Notice: Subject to any disclaimer, the term of this patent is extended or adjusted under 35 U.S.C. 154(b) by 33 days.

(21) Appl. No.: 16/195,353

(22) Filed: Nov. 19, 2018

(65) Prior Publication Data

US 2020/0159419 A1    May 21, 2020

(51) Int. Cl.
 *G11C 29/00* (2006.01)
 *G06F 3/06* (2006.01)
 (Continued)

(52) U.S. Cl.
 CPC ............ *G06F 3/0616* (2013.01); *G06F 3/068* (2013.01); *G06F 3/0659* (2013.01);
 (Continued)

(58) Field of Classification Search
 CPC ...... G06F 3/0616; G06F 3/0659; G06F 3/068; G06F 11/1068; G06F 12/0815;
 (Continued)

(56) References Cited

U.S. PATENT DOCUMENTS

| 4,775,932 A | 10/1988 | Oxley |
| 5,930,167 A | 7/1999 | Lee |

(Continued)

FOREIGN PATENT DOCUMENTS

| JP | 2003022209 | 1/2003 |
| JP | 2011175422 | 9/2011 |

(Continued)

OTHER PUBLICATIONS https://web.archive.org/web/20071130235034/http://en.wikipedia.org:80/wiki/logical_block_addressing wikipedia screen shot retriefed on wayback Nov. 20, 2007 showing both physical and logical addressing used historically to access data on storage devices (Year: 2007).

(Continued)

*Primary Examiner* — Guerrier Merant
(74) *Attorney, Agent, or Firm* — Shun Yao; Park, Vaughan, Fleming & Dowler LLP

(57) ABSTRACT

One embodiment facilitates global data placement in a storage device. The system receives a request to write first data. The system selects one of a plurality of physical media of the storage device to which to directly write the first data, based on a frequency of access, a block size, and a latency requirement of the first data, wherein the plurality of physical media includes a fast cache medium, a solid state drive, and a hard disk drive. In response to determining that the frequency of access of the first data is greater than a predetermined threshold, or in response to determining that the block size associated with the first data is not greater than a predetermined size and determining that the first data is an update to existing data, the system selects the fast cache medium. The system writes the first data to the selected one physical medium.

20 Claims, 14 Drawing Sheets

(51) Int. Cl.
    *G06F 11/10* (2006.01)
    *G11C 29/52* (2006.01)
    *G06F 12/0815* (2016.01)
(52) U.S. Cl.
    CPC ...... *G06F 11/1068* (2013.01); *G06F 12/0815* (2013.01); *G11C 29/52* (2013.01); *G06F 2212/1036* (2013.01); *G06F 2212/205* (2013.01)
(58) Field of Classification Search
    CPC .... G06F 3/0631; G06F 3/0685; G06F 3/0658; G06F 3/0605; G06F 3/0649; G06F 12/06; G06F 12/02; G06F 12/00; G11C 29/52
    See application file for complete search history.

(56) References Cited

U.S. PATENT DOCUMENTS

| | | |
|---|---|---|
| 6,148,377 A | 11/2000 | Carter |
| 6,226,650 B1 | 5/2001 | Mahajan et al. |
| 7,565,454 B2 | 7/2009 | Zuberi |
| 7,958,433 B1 | 6/2011 | Yoon |
| 8,085,569 B2 | 12/2011 | Kim |
| 8,144,512 B2 | 3/2012 | Huang |
| 8,166,233 B2 | 4/2012 | Schibilla |
| 8,260,924 B2 | 9/2012 | Koretz |
| 8,281,061 B2 | 10/2012 | Radke |
| 8,452,819 B1 | 5/2013 | Sorenson, III |
| 8,516,284 B2 | 8/2013 | Chan |
| 8,751,763 B1 | 6/2014 | Ramarao |
| 8,825,937 B2 | 9/2014 | Atkisson |
| 9,043,545 B2 | 5/2015 | Kimmel |
| 9,088,300 B1 | 7/2015 | Chen |
| 9,092,223 B1 | 7/2015 | Pani |
| 9,280,472 B1 | 3/2016 | Dang |
| 9,280,487 B2 | 3/2016 | Candelaria |
| 9,436,595 B1 | 9/2016 | Benitez |
| 9,529,601 B1 | 12/2016 | Dharmadhikari |
| 9,588,698 B1 | 3/2017 | Karamcheti |
| 9,588,977 B1 | 3/2017 | Wang |
| 10,013,169 B2 | 7/2018 | Fisher |
| 10,229,735 B1 | 3/2019 | Natarajan |
| 10,235,198 B2 | 3/2019 | Qiu |
| 2002/0010783 A1 | 1/2002 | Primak |
| 2002/0073358 A1 | 6/2002 | Atkinson |
| 2002/0161890 A1 | 10/2002 | Chen |
| 2003/0163594 A1 | 8/2003 | Aasheim |
| 2003/0163633 A1 | 8/2003 | Aasheim |
| 2003/0217080 A1 | 11/2003 | White |
| 2004/0010545 A1 | 1/2004 | Pandya |
| 2004/0103238 A1 | 5/2004 | Avraham |
| 2004/0255171 A1 | 12/2004 | Zimmer |
| 2004/0268278 A1 | 12/2004 | Hoberman |
| 2005/0038954 A1 | 2/2005 | Saliba |
| 2005/0097126 A1 | 5/2005 | Cabrera |
| 2005/0177755 A1 | 8/2005 | Fung |
| 2005/0195635 A1 | 9/2005 | Conley |
| 2005/0235067 A1 | 10/2005 | Creta |
| 2005/0235171 A1 | 10/2005 | Igari |
| 2006/0156012 A1 | 7/2006 | Beeson |
| 2007/0033323 A1 | 2/2007 | Gorobets |
| 2007/0061502 A1 | 3/2007 | Lasser |
| 2007/0101096 A1 | 5/2007 | Gorobets |
| 2007/0283081 A1 | 12/2007 | Lasser |
| 2007/0285980 A1 | 12/2007 | Shimizu |
| 2008/0034154 A1 | 2/2008 | Lee |
| 2008/0112238 A1 | 5/2008 | Kim |
| 2008/0301532 A1 | 12/2008 | Uchikawa |
| 2009/0113219 A1 | 4/2009 | Aharonov |
| 2009/0282275 A1 | 11/2009 | Yermalayeu |
| 2009/0307249 A1 | 12/2009 | Koifman |
| 2009/0310412 A1 | 12/2009 | Jang |
| 2010/0169470 A1 | 7/2010 | Takashige |
| 2010/0217952 A1 | 8/2010 | Iyer |
| 2010/0229224 A1 | 9/2010 | Etchegoyen |
| 2010/0325367 A1 | 12/2010 | Kornegay |
| 2011/0055458 A1 | 3/2011 | Kuehne |
| 2011/0055471 A1 | 3/2011 | Thatcher |
| 2011/0099418 A1 | 4/2011 | Chen |
| 2011/0153903 A1 | 6/2011 | Hinkle |
| 2011/0161784 A1 | 6/2011 | Selinger |
| 2011/0191525 A1* | 8/2011 | Hsu ........................ G06F 12/00 711/103 |
| 2011/0218969 A1 | 9/2011 | Anglin |
| 2011/0231598 A1 | 9/2011 | Hatsuda |
| 2011/0292538 A1 | 12/2011 | Haga |
| 2011/0299317 A1 | 12/2011 | Shaeffer |
| 2011/0302353 A1 | 12/2011 | Confalonieri |
| 2012/0084523 A1 | 4/2012 | Littlefield |
| 2012/0117399 A1 | 5/2012 | Chan |
| 2012/0147021 A1 | 6/2012 | Cheng |
| 2012/0159289 A1 | 6/2012 | Piccirillo |
| 2012/0210095 A1 | 8/2012 | Nellans |
| 2012/0246392 A1 | 9/2012 | Cheon |
| 2012/0278579 A1 | 11/2012 | Goss |
| 2012/0284587 A1 | 11/2012 | Yu |
| 2013/0061029 A1 | 3/2013 | Huff |
| 2013/0073798 A1 | 3/2013 | Kang |
| 2013/0080391 A1 | 3/2013 | Raichstein |
| 2013/0145085 A1 | 6/2013 | Yu |
| 2013/0145089 A1 | 6/2013 | Eleftheriou |
| 2013/0151759 A1 | 6/2013 | Shim |
| 2013/0159251 A1 | 6/2013 | Skrenta |
| 2013/0166820 A1 | 6/2013 | Batwara |
| 2013/0173845 A1 | 7/2013 | Aslam |
| 2013/0191601 A1 | 7/2013 | Peterson |
| 2013/0219131 A1 | 8/2013 | Alexandron |
| 2013/0318283 A1 | 11/2013 | Small |
| 2014/0019650 A1 | 1/2014 | Li |
| 2014/0082273 A1 | 3/2014 | Segev |
| 2014/0108414 A1 | 4/2014 | Stillerman |
| 2014/0181532 A1 | 6/2014 | Camp |
| 2014/0195564 A1 | 7/2014 | Talagala |
| 2014/0233950 A1 | 8/2014 | Luo |
| 2014/0250259 A1 | 9/2014 | Ke |
| 2014/0279927 A1 | 9/2014 | Constantinescu |
| 2014/0304452 A1 | 10/2014 | De La Iglesia |
| 2014/0310574 A1 | 10/2014 | Yu |
| 2014/0359229 A1 | 12/2014 | Cota-Robles |
| 2014/0365707 A1 | 12/2014 | Talagala |
| 2015/0019798 A1 | 1/2015 | Huang |
| 2015/0082317 A1 | 3/2015 | You |
| 2015/0106556 A1 | 4/2015 | Yu |
| 2015/0106559 A1 | 4/2015 | Cho |
| 2015/0142752 A1 | 5/2015 | Chennamsetty |
| 2015/0227316 A1 | 8/2015 | Warfield |
| 2015/0277937 A1 | 10/2015 | Swanson |
| 2015/0301964 A1 | 10/2015 | Brinicombe |
| 2015/0304108 A1 | 10/2015 | Obukhov |
| 2015/0363271 A1 | 12/2015 | Haustein |
| 2015/0372597 A1 | 12/2015 | Luo |
| 2016/0014039 A1 | 1/2016 | Reddy |
| 2016/0026575 A1 | 1/2016 | Samanta |
| 2016/0048341 A1 | 2/2016 | Constantinescu |
| 2016/0098344 A1 | 4/2016 | Gorobets |
| 2016/0110254 A1 | 4/2016 | Cronie |
| 2016/0162187 A1 | 6/2016 | Lee |
| 2016/0179399 A1 | 6/2016 | Melik-Martirosian |
| 2016/0203000 A1 | 7/2016 | Parmar |
| 2016/0232103 A1 | 8/2016 | Schmisseur |
| 2016/0239074 A1 | 8/2016 | Lee |
| 2016/0239380 A1 | 8/2016 | Wideman |
| 2016/0274636 A1 | 9/2016 | Kim |
| 2016/0306853 A1 | 10/2016 | Sabaa |
| 2016/0343429 A1 | 11/2016 | Nieuwejaar |
| 2016/0350002 A1 | 12/2016 | Vergis |
| 2016/0350385 A1 | 12/2016 | Poder |
| 2016/0364146 A1 | 12/2016 | Kuttner |
| 2017/0010652 A1 | 1/2017 | Huang |
| 2017/0075583 A1 | 3/2017 | Alexander |
| 2017/0075594 A1 | 3/2017 | Badam |
| 2017/0109232 A1 | 4/2017 | Cha |
| 2017/0147499 A1 | 5/2017 | Mohan |
| 2017/0161202 A1 | 6/2017 | Erez |

(56) References Cited

U.S. PATENT DOCUMENTS

| | | |
|---|---|---|
| 2017/0162235 A1 | 6/2017 | De |
| 2017/0168986 A1 | 6/2017 | Sajeepa |
| 2017/0212708 A1 | 7/2017 | Suhas |
| 2017/0228157 A1 | 8/2017 | Yang |
| 2017/0249162 A1 | 8/2017 | Tsirkin |
| 2017/0262178 A1 | 9/2017 | Hashimoto |
| 2017/0285976 A1 | 10/2017 | Durham |
| 2017/0286311 A1 | 10/2017 | Juenemann |
| 2017/0344470 A1 | 11/2017 | Yang |
| 2017/0344491 A1 | 11/2017 | Pandurangan |
| 2017/0353576 A1 | 12/2017 | Guim Bernat |
| 2018/0024772 A1 | 1/2018 | Madraswala |
| 2018/0024779 A1 | 1/2018 | Kojima |
| 2018/0088867 A1 | 3/2018 | Kaminaga |
| 2018/0107591 A1 | 4/2018 | Smith |
| 2018/0143780 A1 | 5/2018 | Cho |
| 2018/0167268 A1 | 6/2018 | Liguori |
| 2018/0189182 A1 | 7/2018 | Wang |
| 2018/0212951 A1 | 7/2018 | Goodrum |
| 2018/0270110 A1 | 9/2018 | Chugtu |
| 2018/0293014 A1 | 10/2018 | Ravimohan |
| 2018/0329776 A1 | 11/2018 | Lai |
| 2018/0356992 A1* | 12/2018 | Lamberts ............... G06F 3/0631 |
| 2018/0373428 A1 | 12/2018 | Kan |
| 2019/0012111 A1 | 1/2019 | Li |
| 2019/0073262 A1 | 3/2019 | Chen |
| 2019/0205206 A1 | 7/2019 | Hornung |

FOREIGN PATENT DOCUMENTS

| | | |
|---|---|---|
| WO | 9418634 | 8/1994 |
| WO | 1994018634 | 8/1994 |

OTHER PUBLICATIONS

Tsuchiya, Yoshihiro et al. "DBLK: Deduplication for Primary Block Storage", MSST 2011, Denver, CO, May 23-27, 2011 pp. 1-5.

Chen Feng, et al. "CAFTL: A Content-Aware Flash Translation Layer Enhancing the Lifespan of Flash Memory based Solid State Devices"< FAST '11, San Jose, CA Feb. 15-17, 2011, pp. 1-14.

Wu, Huijun et al. "HPDedup: A Hybrid Prioritized Data Deduplication Mechanism for Primary Storage in the Cloud", Cornell Univ. arXiv: 1702.08153v2[cs.DC], Apr. 16, 2017, pp. 1-14.

WOW: Wise Ordering for Writes—Combining Spatial and Temporal Locality in Non-Volatile Caches by Gill (Year: 2005).

Helen H. W. Chan et al. "HashKV: Enabling Efficient Updated in KV Storage via Hashing", https://www.usenix.org/conference/atc18/presentation/chan, (Year: 2018).

Ivan Picoli, Carla Pasco, Bjorn Jonsson, Luc Bouganim, Philippe Bonnet. "uFLIP-OC: Understanding Flash I/O Patterns on Open-Channel Solid-State Drives." APSys'17, Sep. 2017, Mumbai, India. pp. 1-7, 2017, <10.1145/3124680.3124741>. <hal-01654985>.

EMC Powerpath Load Balancing and Failover Comparison with native MPIO operating system solutions. Feb. 2011.

S. Hong and D. Shin, "NAND Flash-Based Disk Cache Using SLC/MLC Combined Flash Memory," 2010 International Workshop on Storage Network Architecture and Parallel I/Os, Incline Village, NV, 2010, pp. 21-30.

Arpaci-Dusseau et al. "Operating Systems: Three Easy Pieces", Originally published 2015; Pertinent: Chapter 44; flash-based SSDs, available at http://pages.cs.wisc.edu/~remzi/OSTEP/.

* cited by examiner

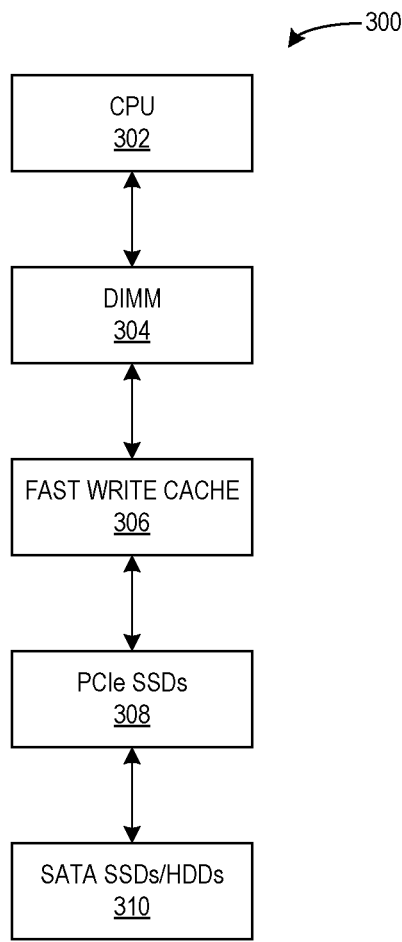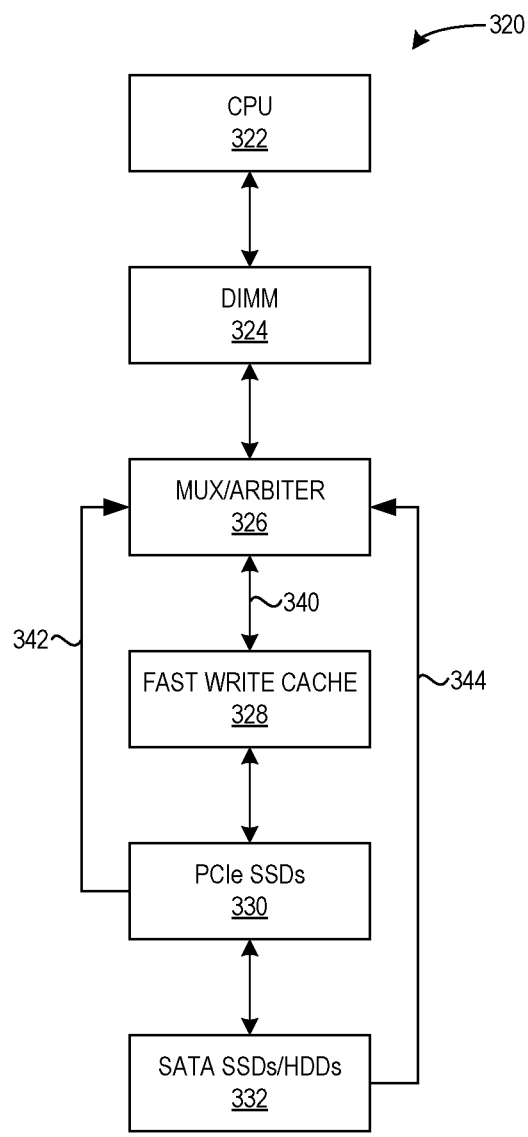
FIG. 3A
(PRIOR ART)
FIG. 3B

SYSTEM AND METHOD FOR OPTIMIZATION OF GLOBAL DATA PLACEMENT TO MITIGATE WEAR-OUT OF WRITE CACHE AND NAND FLASH

BACKGROUND

Field

This disclosure is generally related to the field of data storage. More specifically, this disclosure is related to a system and method for optimization of global data placement to mitigate wear-out of the write cache and NAND flash.

Related Art

The proliferation of the Internet and e-commerce continues to create a vast amount of digital content. Various storage systems and servers have been created to access and store such digital content. In cloud or clustered storage systems, multiple applications may share the underlying system resources (e.g., of a storage device). Managing the resources of a storage device is critical both for the performance of the system, and to satisfy any Quality of Service (QoS) requirements (e.g., in a service level agreement). Conventional storage systems use a write cache to merge input/output (I/O) requests and to reduce latency involved in performing a write operation. Recently, conventional storage systems use the Not-And (NAND) flash storage of a solid state drive (SSD) as the write cache for a hard disk drive (HDD). As the demand for performance increases, conventional storage systems use a "fast" write cache in front of the SSD. That is, I/O requests (and associated data) must travel through the fast write cache before reaching the SSD(s).

However, because the fast cache can incur a significant financial cost, the fast cache typically has a much smaller capacity than the corresponding SSD(s). Furthermore, because all data associated with a write request from a host must first travel through the fast write cache before being copied to the SSD(s), the fast cache must be equipped with high endurance for sustaining the high amount of usage over a period of years. Thus, while the fast cache can be used to perform I/O requests, the fast cache can also create a bottleneck in terms of endurance and performance, including potential I/O blocking for serial operations. This bottleneck can reduce the efficiency and performance of the overall storage system.

SUMMARY

One embodiment facilitates global data placement in a storage device. During operation, the system receives a request to write first data to the storage device. The system selects, based on at least one factor, at least one of a plurality of physical media of the storage device to which to write the first data, wherein the plurality of physical media includes at least two different media. The system writes the first data to the at least one selected physical medium.

In some embodiments, the at least one factor includes one or more of: a frequency of access of the first data; a block size associated with the first data; and a latency requirement for the first data. The two different media include one or more of: a fast cache medium; a solid state drive; and a hard disk drive. Selecting the at least one physical medium involves: in response to determining that the frequency of access of the first data is greater than a predetermined threshold, selecting the fast cache medium; and in response to determining that the block size associated with the first data is not greater than a predetermined size and determining that the first data is an update to existing data, selecting the fast cache medium.

In some embodiments, selecting the at least one physical medium further involves the following: in response to determining that the block size associated with the first data is not greater than the predetermined size and determining that the first data is not an update to the existing data, the system selects the solid state drive. Writing the first data to the solid state drive involves: the system merges the first data to a physical page based on a first-in-first-out protocol; and in response to determining that the physical page is full, the system sequentially writes the merged data and remaining data in the physical page to Not-And (NAND) storage of the solid state drive.

In some embodiments, selecting the at least one physical medium further involves, in response to determining that the block size associated with the first data is not greater than the predetermined size and determining that the first data is an update to existing data, and further in response to determining that a last version of the first data is cached in the fast cache medium: the system determines, in the fast cache medium, a data portion at a first physical location and an associated parity portion at a second physical location, wherein the data portion includes the last version which correspond to the first data; the system reads out the last version from the fast cache medium; the system replaces the last version with the first data to obtain a new version of the data portion; and the system encodes the new version to obtain a new parity. Writing the first data to the selected fast cache medium further involves writing the new version and the new parity to the fast cache medium at, respectively, the first physical location and the second physical location.

In some embodiments, selecting the at least one physical medium further involves, in response to determining that the block size associated with the first data is not greater than the predetermined size and determining that the first data is an update to existing data, and further in response to determining that a last version of the first data is not cached in the fast cache medium: the system reads out a user portion from Not-And (NAND) storage of the solid state drive, wherein the user portion includes the last version which corresponds to the first data; the system compares the user portion with the first data to obtain a first difference; the system aligns the first difference; and the system encodes the aligned first difference to obtain an incremental parity. Writing the first data to the selected fast cache medium further involves writing an incremental ECC codeword which includes the aligned first difference and the incremental parity.

In some embodiments, the system detects a condition to move data from the fast cache medium to the solid state drive or a condition to move data from the solid state drive to the hard disk drive, which involves one or more of: in response to identifying warm or cold data in the fast cache medium, the system writes the warm or cold data from the fast cache medium to Not-And (NAND) storage of the solid state drive; in response to recycling data which is marked as old in the NAND storage of the solid state drive, the system retrieves a most recent version of corresponding data in the fast cache medium and writes the most recent version from the fast cache medium to the NAND storage of the solid state drive; and in response to triggering a garbage collection, recycling, or other process which requires moving a second set of data from the fast cache medium to the NAND storage of the solid state drive or from the NAND storage of the solid state drive to the hard disk drive, the system writes the second set of data from the fast cache medium to the NAND storage of the solid state drive or from the NAND storage of the solid state drive to the hard disk drive.

In some embodiments, selecting the at least one physical medium further involves, in response to determining that the frequency of access of the first data is not greater than the predetermined threshold, determining that the block size associated with the first data is greater than the predetermined size, and determining that the latency requirement is not greater than a predetermined level: the system selects the hard disk drive.

In some embodiments, selecting the at least one physical medium further involves, in response to determining that the block size associated with the first data is greater than the predetermined size, and determining that the latency requirement is greater than a predetermined level: the system selects the solid state drive. Writing the first data to the solid state drive involves writing the first data simultaneously over multiple Not-And (NAND) channels to NAND storage of the solid state drive.

BRIEF DESCRIPTION OF THE FIGURES

FIG. 3A illustrates an exemplary architecture, with the write cache in front of the storage devices, in accordance with the prior art.

FIG. 3B illustrates an exemplary architecture, with a module which allows direct access to the write cache and the other storage devices, in accordance with an embodiment of the present application.

In the figures, like reference numerals refer to the same figure elements.

DETAILED DESCRIPTION

Figure 1:
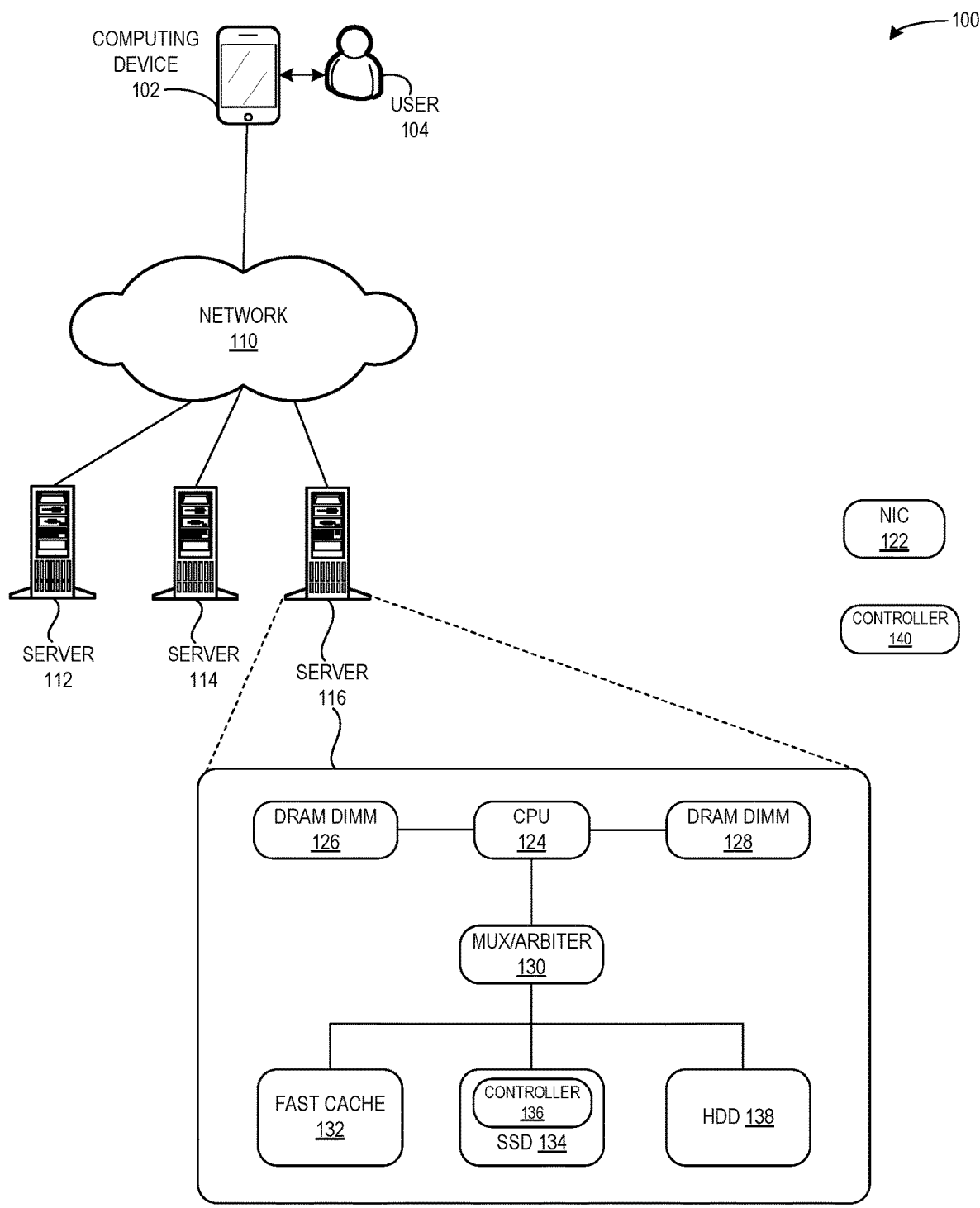
FIG. 1 illustrates an exemplary environment that facilitates global data placement in a storage device, in accordance with an embodiment of the present application.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the embodiments described herein are not limited to the embodiments shown, but are to be accorded the widest scope consistent with the principles and features disclosed herein.

Overview

The embodiments described herein provide a system which solves the endurance and performance bottleneck resulting from the placement of the write cache in front of the physical media of a storage device, by instead using a global data placement layer which can select and write data to one of a plurality of physical media, including the write cache, an SSD, and an HDD.

Conventional storage systems use a write cache to merge I/O requests and to reduce latency involved in performing a write operation. For example, conventional storage systems use NAND flash storage of an SDD as the write cache for an HDD. As the demand for performance increases, conventional storage systems use a "fast" write cache (or "fast cache") in front of the SSD, which forces incoming host write data to travel through the fast write cache before reaching the SSD(s). Because the fast cache can incur a significant financial cost, the fast cache typically has a much smaller capacity than the corresponding SSD(s). Furthermore, because all data associated with a write request from a host must first travel through the fast cache before being copied to the SSD(s), the fast cache must be equipped with high endurance for sustaining the high amount of usage over a period of years. Thus, while the fast cache can be used to perform I/O requests, the fast cache can also create a bottleneck in terms of endurance and performance, including potential I/O blocking for serial operations. This bottleneck can reduce the efficiency and performance of the overall storage system.

The embodiments described herein address this bottleneck by providing a system with a global data placement layer. Instead of placing the fast cache in front of the SSD(s), as in the conventional storage systems, the described system provides a global data placement layer that selects one of a plurality of physical media of the storage device to which to directly write incoming data. The physical medial can include a fast write cache (e.g., a fast cache medium), a solid state drive (SSD), and a hard disk drive (HDD). Given a request to write first data to a storage device, the system can select the physical media based on a number of factors, including: a frequency of access of the first data (e.g., whether the data is "hot," "warm," or "cold"); a block size associated with the first data; a latency requirement for the first data (e.g., based on a particular service level agreement (SLA) or an application-specific need); and whether the first data is an update to existing data (e.g., whether the data to be updated or replaced by the first data exists in the fast cache or in other physical media). An exemplary environment and architecture of the fast cache placement in the prior art in comparison with the fast cache placement/operation in the embodiments of the present application is described below in relation to, respectively, FIGS. 2A/3A and FIGS. 2B/3B.

The global data placement layer can be implemented as a multiplexor/arbiter unit or module, as described below in relation to FIGS. 2B, 3B, and 4. An exemplary diagram illustrating an data flow in a write operation—including the operations related to the factors considered by the global data placement layer in selecting the one physical medium—is described below in relation to FIG. 5. Some specific examples include: data which is determined to be a small-block, hot or non-hot update to existing data can be directly sent to and handled by the fast cache; data which is determined to be a small-block, non-hot, low-latency which is not an update to existing data, or data which is determined to be a large-block, non-hot, high-latency which is or is not an update to existing data, can be directly sent to and handled by NAND media; and data which is determined to be a large-block, non-hot, low-latency which is not an update to existing data can be directly sent to and handled by HDD media. The global data placement layer can consider any combination (e.g., one or more) of the factors in selecting the one physical medium to which to directly write incoming host data (i.e., which physical medium is to handle the data associated with the write request from the host).

Furthermore, when placing data which is an update to existing data (where the existing data is stored either in the fast cache or in the NAND media), the system can use two separate but related techniques. When the existing data to be updated in the fast cache is (already) stored in the fast cache, the system can use the in-place overwrite of the fast cache to iterate through updates (as described below in relation to FIG. 6A). When the existing data to be updated in the fast cache is (already) stored in the NAND, the system can retrieve the data from the NAND, determine a delta difference, align and encode the delta difference to obtain a delta parity, and generate an incremental error correction code (ECC) codeword (as described below in relation to FIG. 6B). The system can use the technique described below for FIG. 6A to iterate through any subsequent updates to existing data in the fast cache (i.e., by updating the incremental ECC codeword).

Thus, the embodiments described herein provide a system which improves and enhances the efficiency and performance of a storage system. By utilizing a global data placement layer, the system can consider various factors in placing data directly to one of a plurality of physical media (e.g., a fast cache, NAND flash storage of an SSD, and an HDD). The described embodiments can thus mitigate the wear-out of both the write cache and the NAND flash, which results in an improved and more efficient storage system.

The terms "global data placement layer" and "multiplexor/arbiter" are used interchangeably in this disclosure, and refer to a unit, module, or layer which can be implemented in software or firmware and performs the functions described herein, including analyzing the various factors, selecting one of a plurality of physical media of a storage device to which to write data, and writing the data to the selected one physical medium.

The terms "storage drive" or "storage device" refer to a device or system which can include at least one physical media to which to write or store data.

The terms "physical media" and "physical medium" are used interchangeably in this disclosure, and refer to any physical media/medium which is capable of storing data, and includes but is not limited to: a fast cache; a solid state drive (SSD); Not-And (NAND) flash storage of an SSD; a hard disk drive (HDD); and a track or zone of an HDD.

The terms "fast cache," "fast cache media," "fast cache medium," "fast write cache," and "persistent write cache" are used interchangeably in this disclosure, and refer to a layer which typically sits between a storage drive and the system memory. In this disclosure, the fast cache is implemented at the same "level" or "hierarchy" as the SSD(s) and HDD(s), and is accessed at the same level or hierarchy based on the analysis of various factors of the incoming host write data by a global data placement layer.

The terms "NAND media," "NAND storage," "NAND flash," "NAND flash storage," "NAND storage of an SSD," and "SSD media" are used interchangeably in this disclosure, and refer to persistent non-volatile memory of a physical media involving NAND and/or SSDs.

The terms "HDD media" and "HDD storage" are used interchangeably in this disclosure, and refer to persistent non-volatile memory of a physical media involving an HDD, including a track or zone of the HDD.

The terms "hot," "warm," and "cold" refer to a level or range of the frequency of access of a given set of data. The level or range corresponding to each term can be based on one or more predetermined thresholds.

Exemplary Environment and Network

FIG. 1 illustrates an exemplary environment 100 that facilitates global data placement in a storage device, in accordance with an embodiment of the present application. Environment 100 can include a computing device 102 and an associated user 104. Computing device 102 can communicate via a network 110 with storage servers 112, 114, and 116, which can be part of a distributed storage system and accessed via client servers (not shown). A storage server can include multiple storage devices, and each storage device can include a controller and multiple physical media for data storage. A storage server can also be a storage device. For example, server 116 can include: a network interface card (NIC) (not shown); a CPU 124; dynamic random access memory dual in-line memory modules (DRAM DIMMs) 126 and 128; a multiplexor/arbiter ("mux/arbiter") unit 130; a fast cache 132; an SSD 134 with a controller 136; and an HDD 138. Mux/arbiter unit 130 can be implemented as software or firmware with instructions which, when executed, can facilitate a global data placement layer, which performs the analysis and decision-making operations to select a physical media (as described below in relation to FIGS. 3B, 4, and 5). In some embodiments, mux/arbiter unit 130 may be implemented as a specific hardware component, unit, or module.

By including mux/arbiter unit 130, server 116 can perform the operations described herein to optimize the global data placement in order to mitigate the wear-out of the fast cache and NAND storage of an SSD, which results in improving and enhancing the efficiency and performance of server 116 and the overall storage system.

Figure 2A:
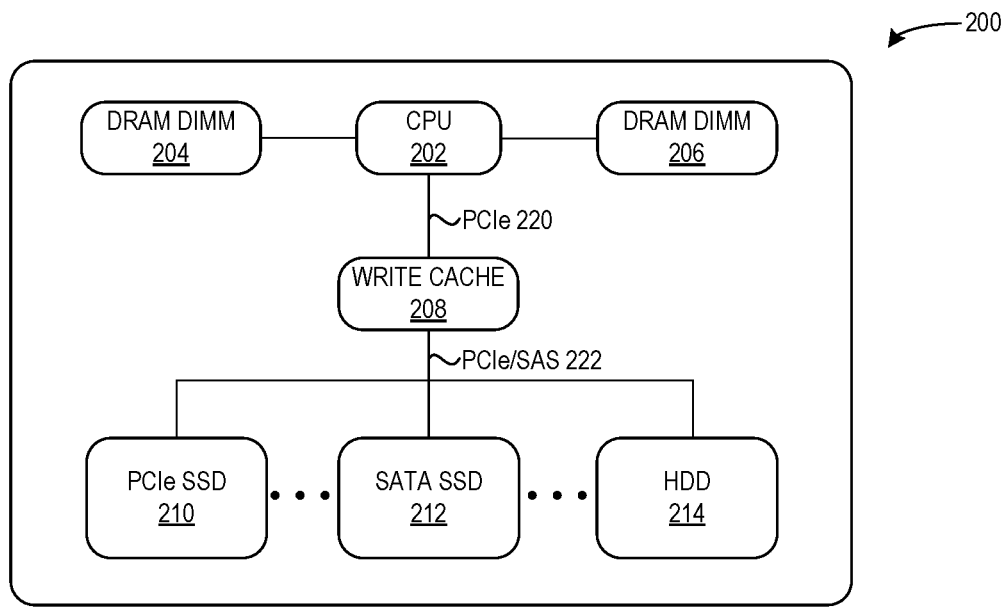
FIG. 2A illustrates an exemplary environment, with the write cache in front of the storage devices, in accordance with the prior art.

Fast Write Cache Placement and Architecture in the Prior Art Vs. The Described Embodiments FIG. 2A illustrates an exemplary environment 200, with the write cache in front of the storage devices, in accordance with the prior art. Environment 200 can include: a CPU 202; DRAM DIMMs 204 and 206; a write cache 208; and multiple SSD and HDD devices, such as a Peripheral Component Interconnect Express (PCIe) SSD 210, a Serial AT Attachment (SATA) SSD 212, and an HDD 214. CPU 202 can communicate with write cache 208 based on a PCIe protocol 220. Write cache 208 can communicate with devices 210-214 based on a PCIe/SAS (Serial Attached Small Computer System Interface (SCSI)) protocol 222, depending on the specific device.

In prior art environment 200, all I/O data (e.g., all host write data) must first be sequentially written to write cache 208 before being written to devices 210-214. However, several shortcomings of the prior art environment exist. First, because all incoming I/O data is written first to write cache 208, the large amount of total data eventually destined for the higher-capacity SSD and HDD devices can quickly wear out write cache 208. Thus, write cache 208 is required to be a high-endurance unit which can sustain the high amount of usage that it will experience over a period of years.

Second, because the write data may be stored for a long period of time in write cache 208, the minimal capacity of write cache 208 must increase correspondingly with the high capacity of the SSDs and HDDs (which are on the order of tens of high-capacity storage devices) in order to avoid overflow. Thus, write cache 208 is required to maintain a high capacity, which can result in a significant increase in the total cost of operation (TCO).

Third, write cache 208 uses the same PCIe protocol used by PCIe SSD 210. This single and narrow data entrance point can result in a performance bottleneck, especially when compared to the high parallelism of PCIe SSDs. That is, because data flows in a serial manner through write cache 208 and the PCIe SSDs, the throughput of write cache 208 may impose a performance limit on a group of PCIe SSDs.

Fourth, the lack of data separation based on frequency of access (e.g., whether data is "hot," "warm," or "cold") results in cold data being written to write cache 208 along with hot data. However, because the cold data is not frequently updated, the cold data takes up precious capacity in write cache 208, which can lead to the wear-out of the write cache.

Thus, in conventional storage systems (as in prior art environment 200), the placement of the write cache in front of the SSD and HDD storage devices can result in a bottleneck in terms of endurance and performance. This bottleneck can further reduce the efficiency of the overall storage system.

Figure 2B:
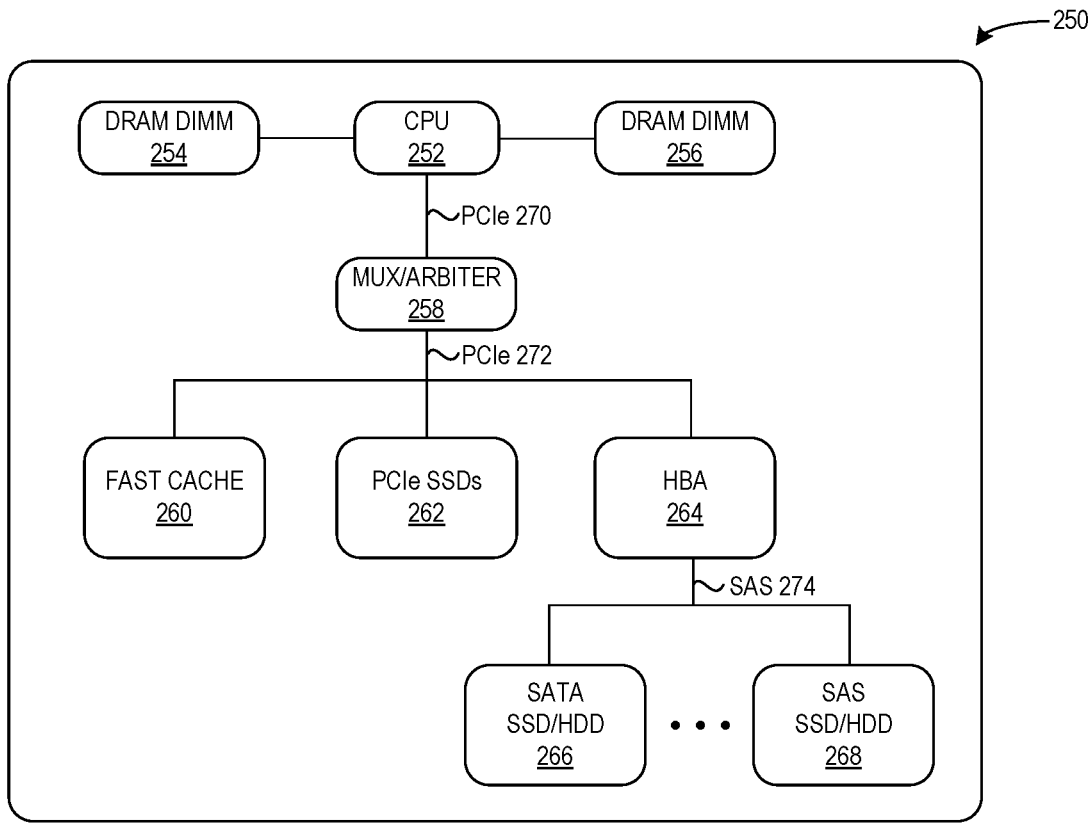
FIG. 2B illustrates an exemplary environment, with the write cache at the same level or hierarchy of access as the storage devices, in accordance with an embodiment of the present application.

FIG. 2B illustrates an exemplary environment 250, with the write cache at the same level or hierarchy of access as the storage devices, in accordance with an embodiment of the present application. Environment 250 can include: a CPU 252; DRAM DIMMs 254 and 256; a mux/arbiter 258; a fast cache 260; PCIe SSDs 262; and a host bus adaptor (HBA) 264 coupled to multiple SSD and HDD devices, such as a SATA SSD/HDD 266 and an SAS SSD/HDD 268.

CPU 252 can communicate with mux/arbiter 258 based on a PCIe protocol 270. Mux/arbiter 258 can communicate with fast cache 260, PCIe SSDs 262, and HBA 264 via a PCIe protocol 272. HBA 264 can communicate with SATA and SAS SSD/HDDs 266 and 268 via an SAS protocol 274.

Thus, in environment 250, mux/arbiter 258 provides for direct global data placement in an optimal physical medium. The optimal data placement is described below in relation to FIGS. 4, 5, and 7A-7C, and can be based on, e.g.: a frequency of access of data to be written; a block size associated with the data to be written; a latency requirement for the data to be written (e.g., associated with a Service Level Agreement (SLA) or an application-specific need); and whether the data to be written is an update to existing data (i.e., data which has already been written to the fast cache, the NAND media, or the HDD).

FIG. 3A illustrates an exemplary architecture 300, with the write cache in front of the storage devices, in accordance with the prior art. In architecture 300, a CPU 302 can communicate with a DIMM 304, which can communicate with a fast write cache 306, which can communicate with PCIe SSDs 308 and SATA SSDs/HDDs 310. Similar to environment 200 of FIG. 2A, architecture 300 depicts how all data associated with a write request must first travel through fast write cache 306 before being written to PCIe SSDs 308 and SATA SSDs/HDDs 310.

In contrast, FIG. 3B illustrates an exemplary architecture 320, with a module 326 which allows direct access to the write cache and the other storage devices, in accordance with an embodiment of the present application. In architecture 320, a CPU 322 can communicate with a DIMM 324, which can communicate with a mux/arbiter module or unit 326. Mux/arbiter 326 can communicate directly with: a fast write cache 328 (via a communication 340); PCIe SSDs 330 (via a communication 342); and SATA SSDs/HDDs 332 (via a communication 344). Communications 340 and 342 can be based on a PCIe protocol (as in PCIe protocol 272 of FIG. 2B). Communication 344 can also be based on a PCIe protocol (as in PCIe protocol 272 of FIG. 2B), conducted through an HBA and an SAS protocol (as in HBA 264 and SAS protocol 274 of FIG. 2B; not shown in FIG. 3B).

Figure 4:
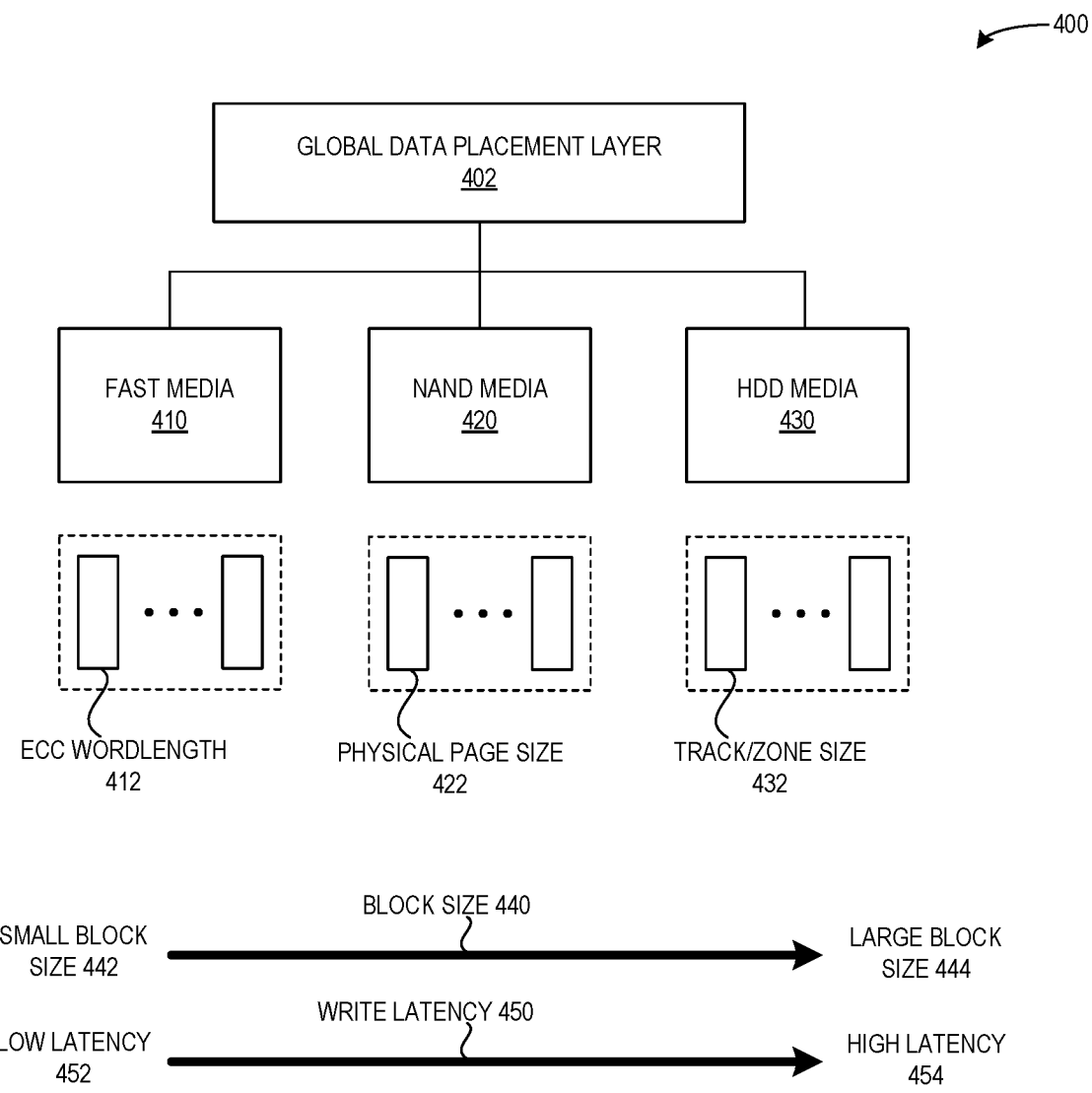
FIG. 4 illustrates an exemplary environment that facilitates global data placement in a storage device, including direct placement to a fast cache medium, NAND storage of an SSD, and an HDD, in accordance with an embodiment of the present application.

Exemplary Environment and Block Diagram for Facilitating Global Data Placement Including Direct Placement to Fast Cache, NAND, and HDD Media FIG. 4 illustrates an exemplary environment 400 that facilitates global data placement in a storage device, including direct placement to a fast cache medium, NAND storage of an SSD, and an HDD, in accordance with an embodiment of the present application. Environment 400 depicts the physical locations exposed by different media based on their characteristics (e.g., access latency, operation unit, etc.). These various characteristics form the key factors for the operation of the global data placement layer to efficiently match application-specific needs.

Environment 400 can include a global data placement layer 402, which can correspond to mux/arbiter 258 of FIG. 2B and mux/arbiter 326 of FIG. 3B. Global data placement layer 402 can determine to place (e.g., store, write, copy, transfer, or move) data in any one of fast media 410, NAND media 420, and HDD media 430. Global data placement layer 402 can determine the global data placement based on various factors, e.g., a block size associated with the data to be written and a latency requirement for the data to be written (e.g., associated with an SLA or an application-specific need). Environment 400 also depicts a scale/direction for these two factors. A block size 440 can be depicted with a small block size 442 on the left side of environment 400, increasing to a large block size 444 on the right side of environment 400. Similarly, a write latency requirement 450 can be depicted with a low latency requirement 452 on the left side of environment 400, increasing to a high latency requirement 454 on the right side of environment 400.

Fast media 410 (e.g., phase change memory (PCM)) can support in-place overwrites, so fast media 410 can store data based on, e.g., an error correction code (ECC) wordlength 412. NAND media 420 can program and read data based on a primary unit of a physical page, so NAND media 420 can store data based on a physical page size 422 (e.g., 16 KB). HDD media 430 can store data based on areal density, error correction strength, and latency optimization, so HDD media 430 can store data in a unit of operation of a track (e.g., ~1-2 MB) or a zone (e.g., 128 MB). That is, HDD media 430 can store data based on a track/zone size 432.

Thus, environment 400 depicts how the described embodiments can expose the space of the various physical media to the host to be managed from a global perspective. The fast write cache is no longer a single physical device, but is redefined as a logical layer which uses the various physical media. By eliminating the need for all incoming host write data to travel through the fast cache, the described embodiments mitigate the wear-out of the fast cache as well as the NAND flash, resulting in the enhancement and improvement of both the efficiency and performance of the storage system.

Figure 5:
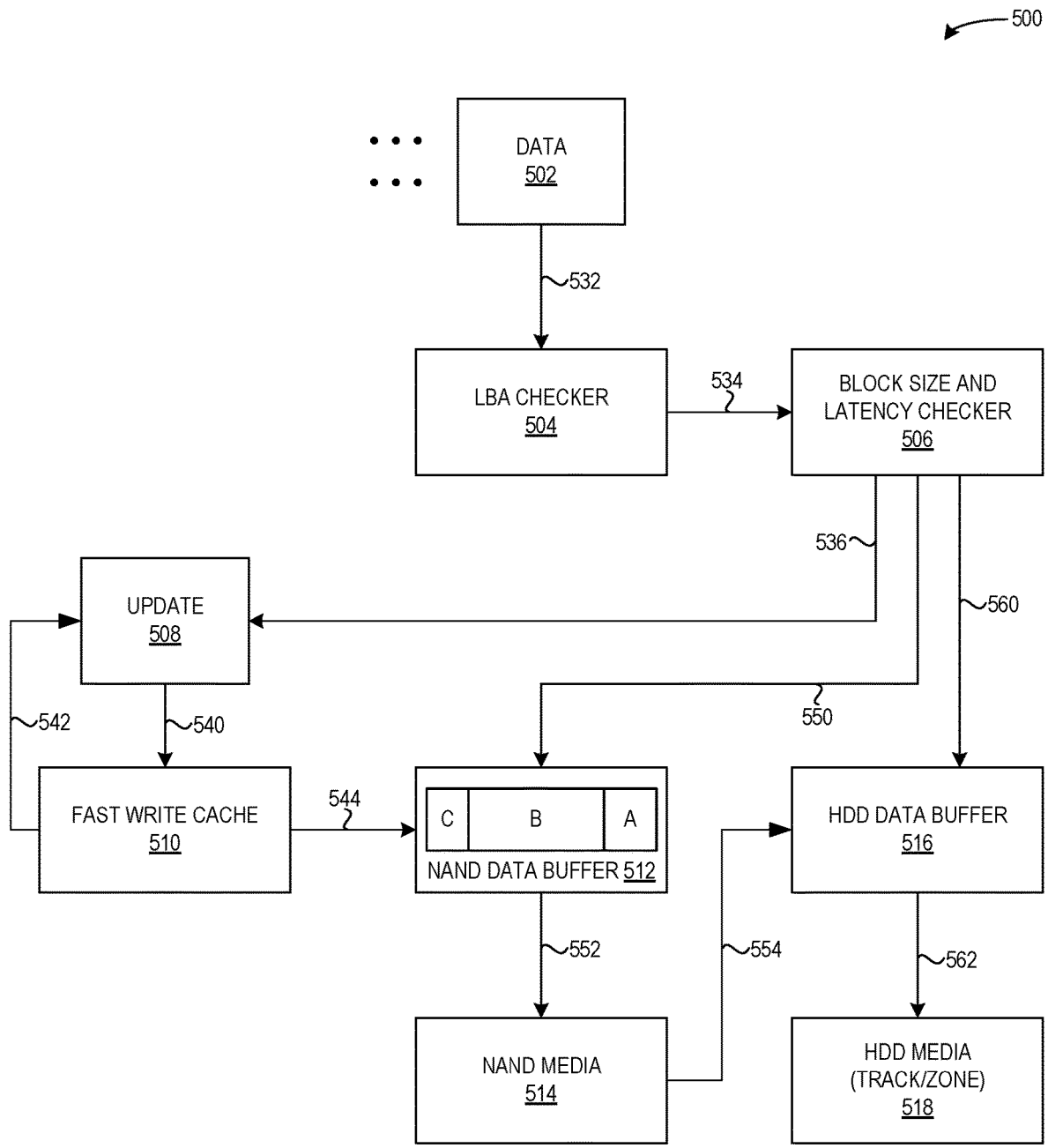
FIG. 5 presents a diagram illustrating an exemplary data flow in a write operation, in accordance with an embodiment of the present application.

FIG. 5 presents a diagram 500 illustrating an exemplary data flow in a write operation, in accordance with an embodiment of the present application. During operation, the system can receive an I/O request with associated data 502 ("the data") to be written to a storage device of the system. The data can travel (via a communication 532) to a logical block address (LBA) checker 504, which determines the access frequency of the data based on its LBA. The data can then be sent to a block size and latency checker 506 (via a communication 534), which can send the data for global placement based on the block size associated with the data and the latency requirement for the data. For example, if the data is frequently accessed (e.g., "hot" data) and is of a small block size, block size and latency checker 506 can send the data (via a communication 536) to an update module 508, which writes the data to a fast write cache 510 (via a communication 540). The system can perform in-place overwrites of data in fast write cache 510 (via a communication 542), as described below in relation to FIGS. 6A and 7B. The system can copy, write, flush, or move data from fast write cache 510 to NAND data buffer 512 (via a communication 544), by merging the I/O data to a physical page in the NAND based on a first-in-first-out (FIFO) protocol, e.g., using a full-page operation as per the conventional standard for writing data to NAND media. Note that in communication 544, the system eliminates the need for zero-padding because the I/O data is merged directly to NAND data buffer 512. This can result in mitigating the write amplification, which can improve both the efficiency and performance of the storage system. Communication 544 may occur periodically, e.g., in response to detecting a condition to move data from fast write cache 510 to NAND data buffer 512 (as described below in relation to FIG. 7C).

As another example, if the data is not frequently accessed (e.g., "cold" or "not hot" data) and is of a small block size, block size and latency checker 506 can send the data (via a communication 550) to NAND data buffer 512. Once data (such as "C", "B," and "A") in NAND data buffer 512 fills an entire physical page, the system can write the data (via a communication 552) to NAND media 514. In addition, if the data is not frequently accessed (e.g., "cold" or "not hot" data), is of a large block size, and has a high latency requirement, block size and latency checker 506 can also send the data (via a communication 550) to NAND data buffer 512.

In contrast, if the data is not frequently accessed, is of a large block size, and has a low latency requirement, block size and latency checker 506 can send the data (via a communication 560) to an HDD data buffer 516, where, in response to a certain condition, data from HDD data buffer 516 is written (via a communication 562) to HDD media (track/zone) 518.

Furthermore, in response to detecting a condition to move, flush, or copy certain data from NAND media 514 to HDD media 518, the system can send the certain data (via a communication 554) to HDD data buffer 516, where the data in HDD data buffer 516 is eventually written (via a communication 562) to HDD media (track/zone) 518. The condition can include, e.g.: identifying warm or cold data in the fast cache which is to moved from the fast cache to the NAND; recycling data which is marked as old in NAND; and triggering a garbage collection, recycling, or other process which requires moving data from the fast cache to the NAND, or from the NAND to the HDD. Detecting the condition to move data from the fast cache media to the NAND media (or from the NAND media to the HDD media) is described below in relation to FIG. 7C.

The above communications are illustrative of the data placement possibilities and options that are available to the system of the embodiments of the system described herein. The system can also place incoming host write data in these various physical media based on any combination or weighting of the mentioned factors (including access frequency, block size, latency requirement, and whether the data is an update to existing data). For example, if the data is not frequently accessed, is of small block size, and is an update to existing data (which is stored either in the fast cache or in the NAND media), block size and latency checker 506 can send the data (via communication 536) to update module 508, which can write the data to fast write cache 510 (via communication 540). Updating data in the fast cache media is described below in relation to FIGS. 6A and 6B.

Updating Data in the Fast Cache Media

Figure 6A:
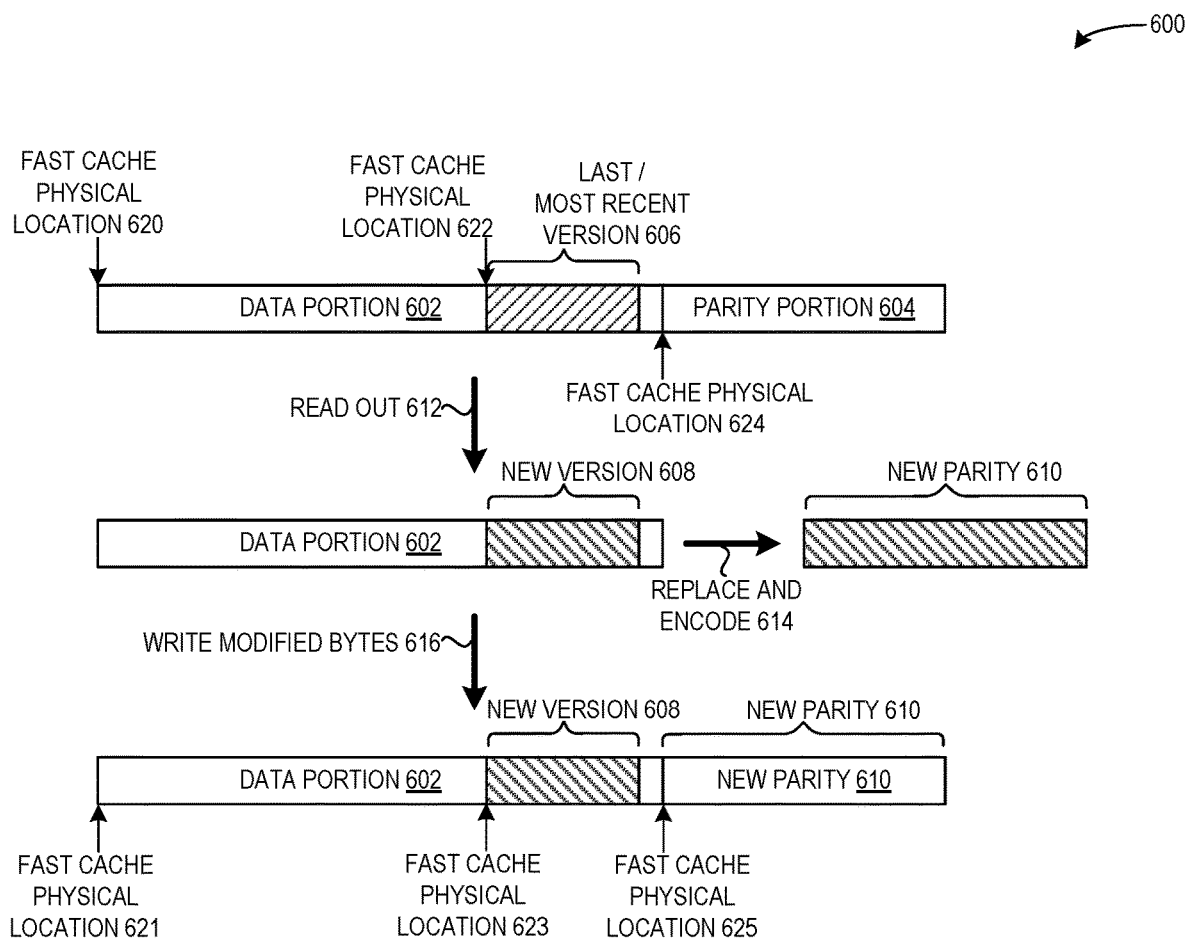
FIG. 6A presents a diagram illustrating an exemplary data flow in a write operation, including an update in the fast cache when the last version is stored in the fast cache, in accordance with an embodiment of the present application.

FIG. 6A presents a diagram 600 illustrating an exemplary data flow in a write operation, including an update in the fast cache when the last version is stored in the fast cache, in accordance with an embodiment of the present application. Diagram 600 depicts data stored in a fast cache media, including: a data portion 602, which includes a last/most recent version 606 of data which is to be written to the fast cache media (indicated by diagonally right-slanting lines); and a parity portion 604 which corresponds to data portion 602. Data portion can be located at a fast cache physical location 620; last/most recent version 606 can be located at a fast cache physical location 622; and parity portion 604 can be located at a fast cache physical location 624.

The system can read out last version 606 (function 612), and replace last version 606 with a new version 608 (indicated by diagonally left-slanting lines), which corresponds to the data to be written (function 614). The system can also encode the data portion including the replaced new version 608, to obtain a new parity 610 (function 614). The system can write the modified bytes (function 616) from new version 608 and new parity 610 to the same physical location in the fast cache. That is, a fast cache physical location 621 is the same location as fast cache physical location 620; a fast cache physical location 623 is the same location as fast cache physical location 622; and a fast cache physical location 625 is the same location as fast cache physical location 624. Thus, diagram 600 illustrates the in-place overwrite operation performed in the fast cache when the last version is stored in the fast cache.

Figure 6B:
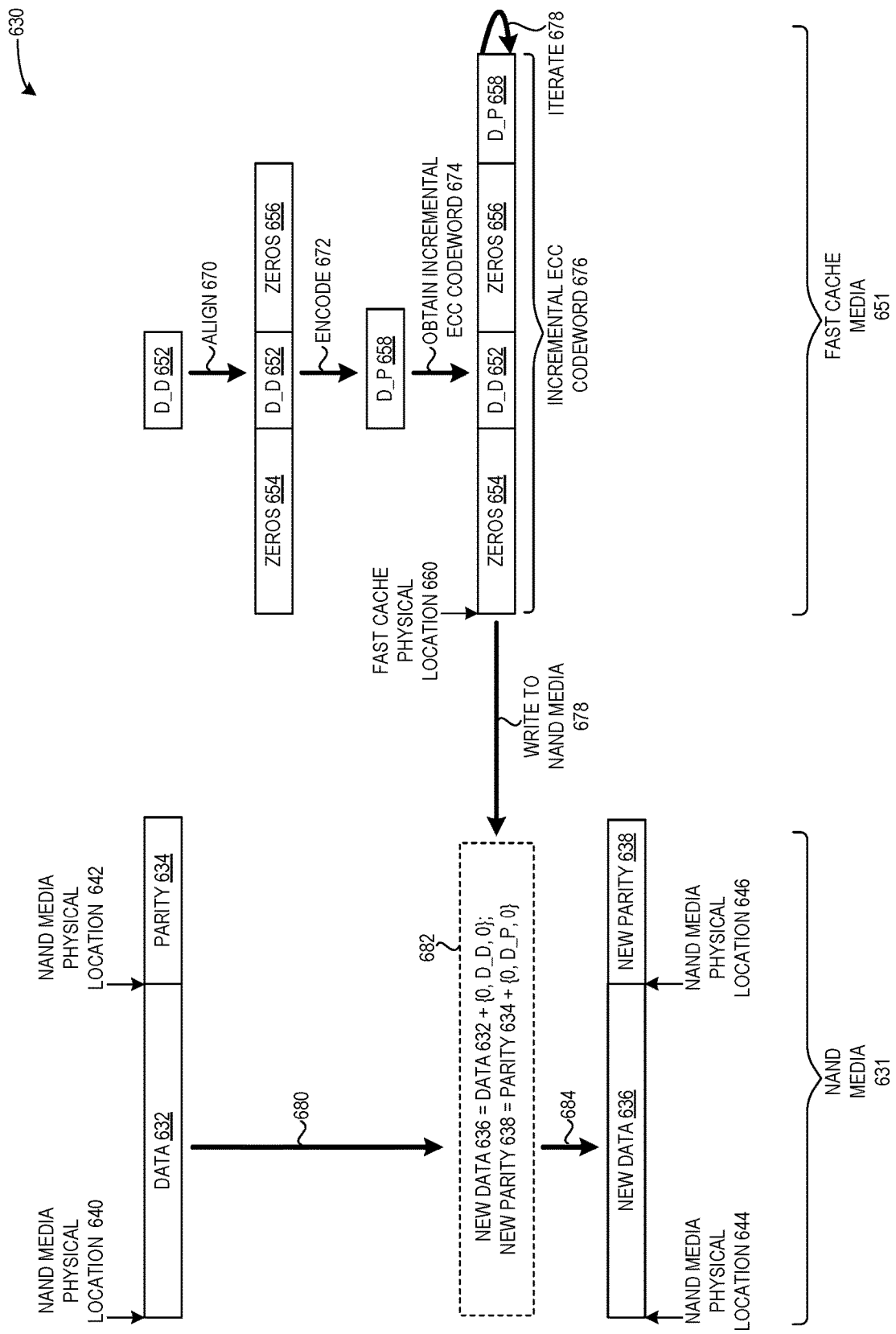
FIG. 6B presents a diagram illustrating an exemplary data flow in a write operation, including an update in the fast cache when the last version is not stored in the fast cache, in accordance with an embodiment of the present application.

FIG. 6B presents a diagram 630 illustrating an exemplary data flow in a write operation, including an update in the fast cache when the last version is not stored in the fast cache, in accordance with an embodiment of the present application. Diagram 600 includes data stored in a NAND media 631 (on the left side of diagram 630) and data stored in a fast cache media 651 (on the right side of diagram 630).

The system can read out a user portion from NAND media 631, where the user portion includes the last version which corresponds to the data to be written (e.g., the data to be updated or replaced). The system can compare the user portion with the data to be written to obtain a first difference (delta_difference or "D_D" 652). The system can align the first difference, including by prepending zeros 654 and appending zeros 656 (function 670). The system can encode the aligned first difference to obtain an incremental parity (delta_parity or "D_P" 658) (function 672). The system can obtain an incremental ECC codeword 676 (function 674), which includes zeros 654, D_D 652, zeros 656, and D_P 658. The system can subsequently iterate through incremental ECC codeword 676 using the method described above for data portion 602 and parity portion 604 of FIG. 6A (function 678, e.g., by performing an in-place overwrite operation). Upon detecting a condition to move, copy, flush, or write data from the fast cache media to the NAND media, the system can write the incremental ECC codeword to the NAND media, as shown in a box 682.

NAND media 631 can include a data portion 632 and a corresponding parity portion 634, located respectively at NAND media physical locations 640 and 642. The system can maintain this copy of data outside fast cache media 651 until this copy is to be moved due to a garbage collection, recycling, or refresh process, or when the write cache is full, or any other condition (as indicated by a communication 680).

Box 682 indicates how to update data 632 and parity 634 in NAND media 631, in response to recycling data which is marked as old in NAND media 631. Upon reading out the user portion from NAND media 631 and determining the first difference (D_D 652), the system can mark data 632 and parity 634 as old (or mark as old the portions corresponding to the retrieved user portion of data 632).

Subsequently, the system can detect a condition to move, copy, flush, or write data from fast cache media 651 to NAND media 631. For example, if the system detects a condition which triggers recycling of data marked as old in the NAND media, the system can retrieve the latest version from fast cache media 651, and write incremental ECC codeword 676 to NAND media 631 (function 678, as illustrated further in box 682), by: determining a new data 636, which can include a comparison of old data 632 with incremental ECC codeword 676 to determine the contents of new data 636; and determining a new parity 638, which can include a comparison of old parity 634 with incremental ECC codeword 676 to determine the contents of new parity 638. The system can subsequently write new data 636 at a new NAND media physical location 644, and can write new parity 638 at a new NAND media physical location 646.

Thus, diagrams 600 and 630 depict how to update data in the fast cache media, both when the data to be updated exists in the fast cache media (as depicted in the in-place overwrites described above in relation to FIG. 6A) and when the data to be updated only exists in the NAND media (as depicted in the user portion retrieval and incremental ECC codeword generation described above in relation to FIG. 6B).

Exemplary Method for Facilitating Global Data Placement in a Storage Device

Figure 7A:
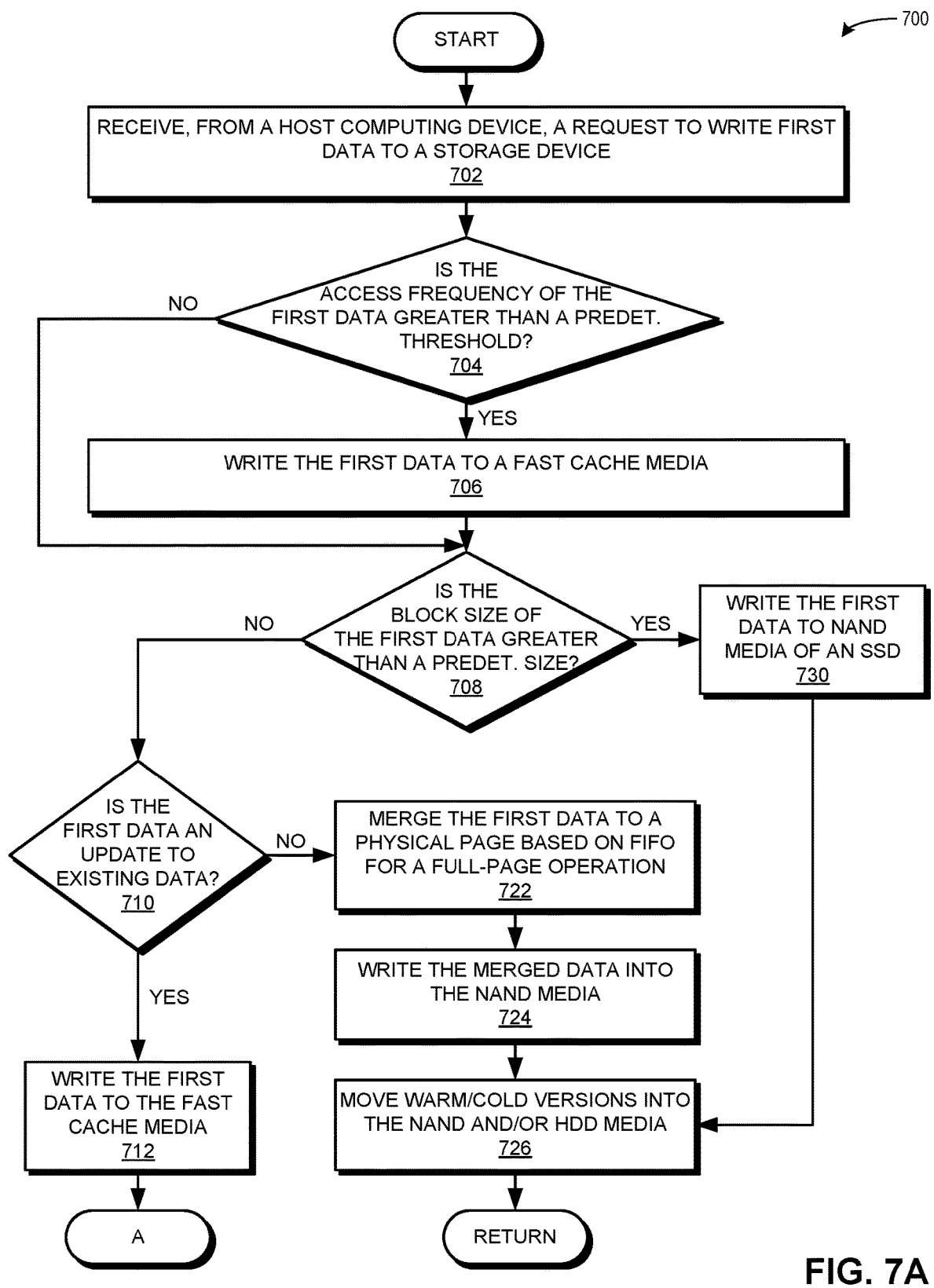
FIG. 7A presents a flowchart illustrating a method for facilitating global data placement in a storage device, in accordance with an embodiment of the present application.

FIG. 7A presents a flowchart 700 illustrating a method for facilitating global data placement in a storage device, in accordance with an embodiment of the present application. During operation, the system receives, from a host computing device, a request to write first data to a storage device (operation 702). If the access frequency of the first data is greater than a predetermined threshold (decision 704), the system writes the first data to a fast cache media (operation 706). If the access frequency of the first data is not greater than the predetermined threshold (decision 704), the operation continues at decision 708.

If the block size of the first data is greater than a predetermined size (decision 708), the system writes the first data to NAND media of an SSD (operation 730), and the operation continues at operation 726. In some embodiments, the system can also write the first data to an HDD, depending on latency requirements (as depicted above in communication 560 of FIG. 5). If the block size of the first data is not greater than a predetermined size (decision 708), and if the first data is an update to existing data, the system writes the first data to the fast cache media (operation 712), and the operation continues at Label A.

If the block size of the first data is not greater than a predetermined size (decision 708), and if the first data is not an update to existing data (decision 710), the system merges the first data to a physical page based on FIFO for a full-page operation (decision 722). The system writes the merged data into the NAND media (operation 724). The system moves warm/cold versions into the NAND and/or HDD media (operation 726), and the operation returns. Conditions and detailed operations relating to operation 726 are described below in relation to FIG. 7C.

Figure 7B:
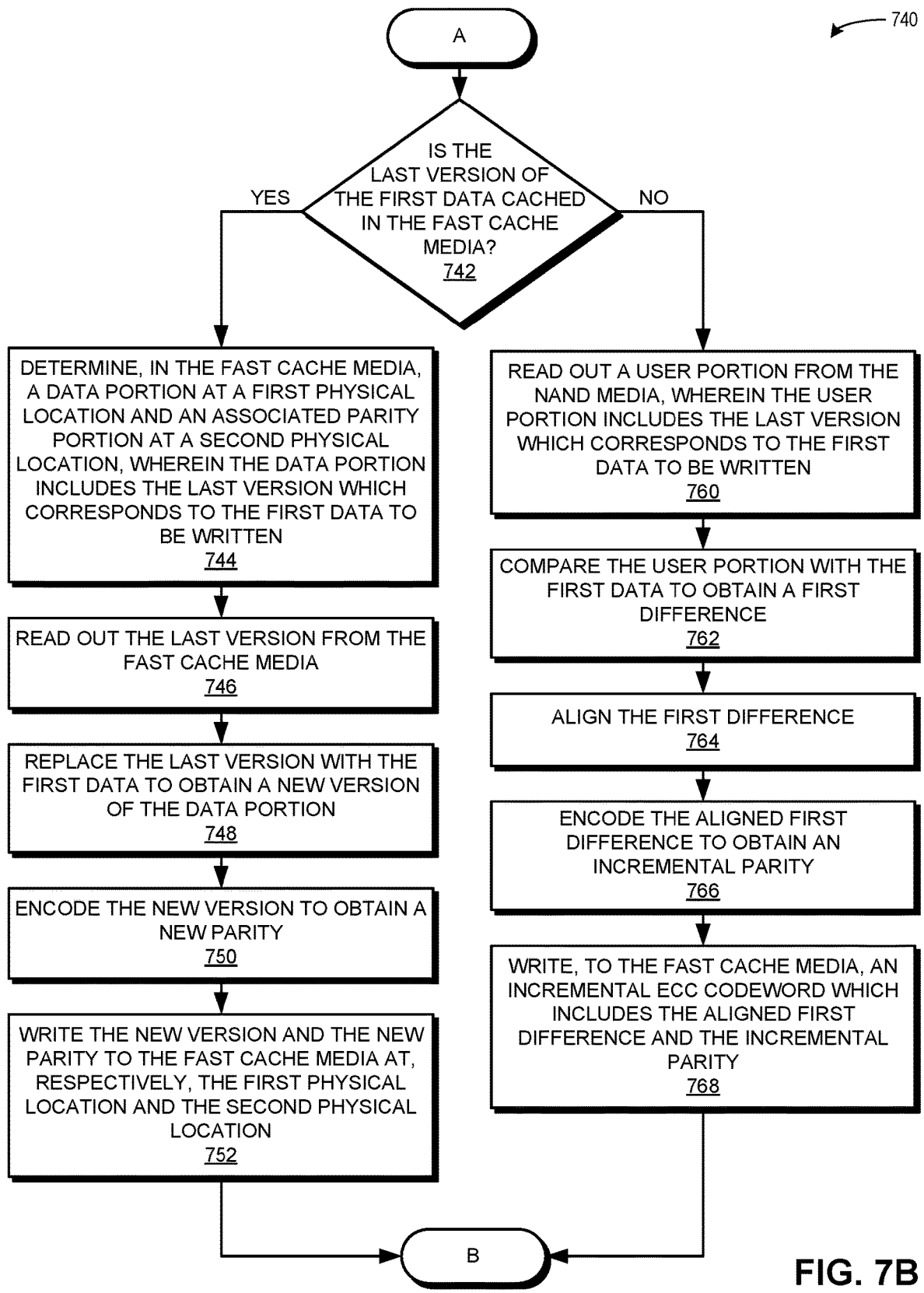
FIG. 7B presents a flowchart illustrating a method for facilitating global data placement in a storage device, including updating the fast cache based on whether or not the last version is stored in the fast cache, in accordance with an embodiment of the present application.

FIG. 7B presents a flowchart 740 illustrating a method for facilitating global data placement in a storage device, including updating the fast cache based on whether or not the last version is stored in the fast cache, in accordance with an embodiment of the present application. During operation, if the last version of the first data is cached in the fast cache media (decision 742), the system performs the following operations 744-752. The system determines, in the fast cache media, a data portion at a first physical location and an associated parity portion at a second physical location, wherein the data portion includes the last version which corresponds to the first data to be written (operation 744). The system reads out the last version from the fast cache media (operation 746). The system replaces the last version with the first data to obtain a new version of the data portion (operation 748). The system encodes the new version to obtain a new parity (operation 750). The system writes the new version and the new parity to the fast cache media at, respectively, the first physical location and the second physical location (operation 752). Thus, the system performs an in-place overwrite in the fast cache media.

If the last version of the first data is not cached in the fast cache media (decision 742), the system performs the following operations 760-768. The system reads out a user portion from the NAND media, wherein the user portion includes the last version which corresponds to the first data to be written (operation 760). The system compares the user portion with the first data to obtain a first difference (operation 762). The system aligns the first difference (operation

764) (e.g., by prepending and appending zeros). The system encodes the aligned first difference to obtain an incremental parity (operation 766). The system writes, to the fast cache media, an incremental ECC codeword which includes the aligned first difference and the incremental parity (operation 768).

Figure 7C:
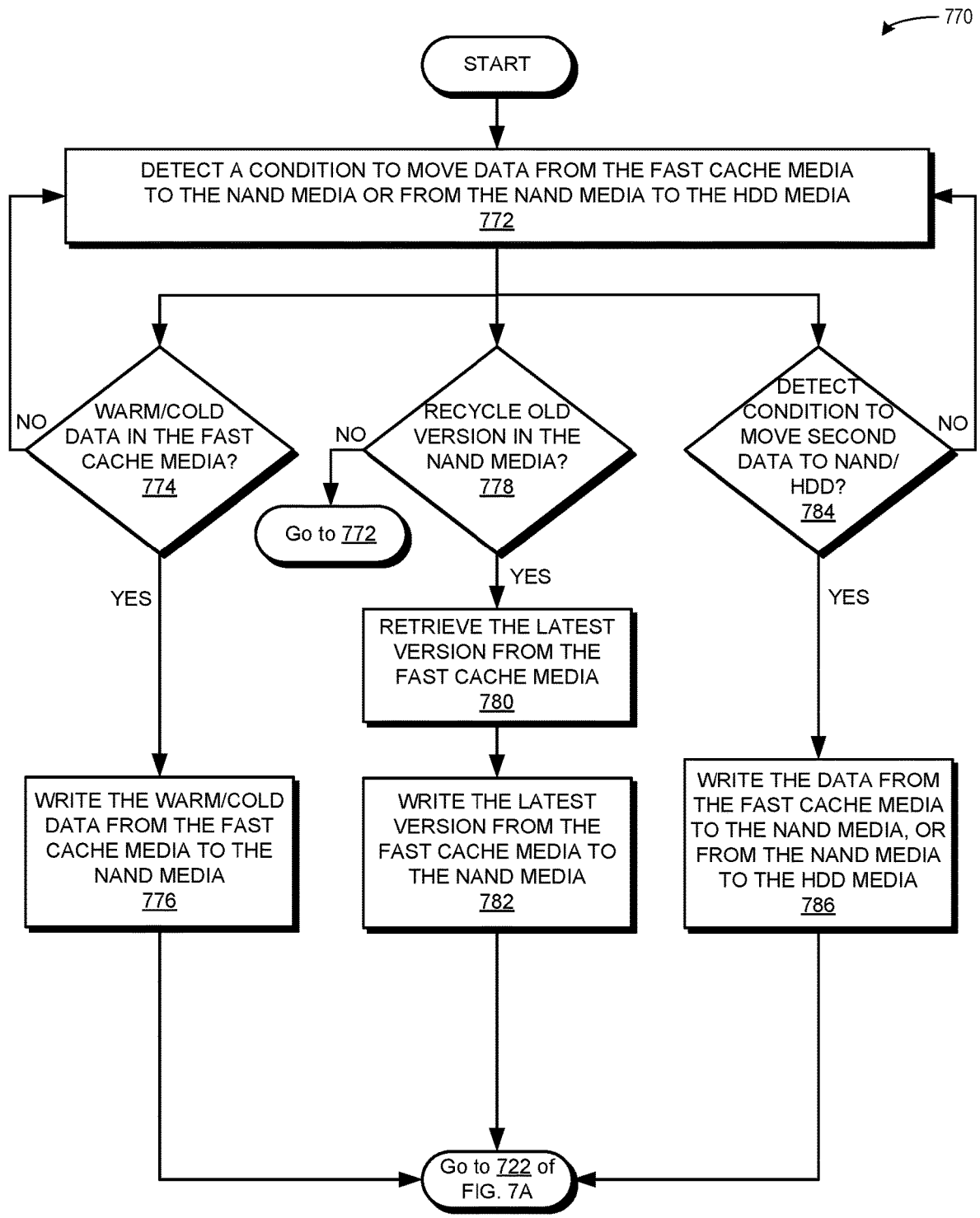
FIG. 7C presents a flowchart illustrating a method for facilitating global data placement in a storage device, including detecting a condition to move data from the fast cache medium to NAND, in accordance with an embodiment of the present application.

FIG. 7C presents a flowchart 770 illustrating a method for facilitating global data placement in a storage device, including detecting a condition to move data from the fast cache medium to NAND, in accordance with an embodiment of the present application. During operation, the system detects a condition to move data from the fast cache media to the NAND media or from the NAND media to the HDD media (operation 772). If the system identifies warm/cold data in the fast cache media (decision 774), the system writes the warm/cold data from the fast cache media to the NAND media (operation 776). If not, the operation returns to operation 772.

If the system recycles an old version of data in the NAND media (decision 778) (e.g., as part of a garbage collection or recycling procedure), the system retrieves the latest version from the fast cache media (operation 780) and writes the latest version from the fast cache media to the NAND media (operation 782). If the system does not recycle the old version of data in the NAND media (decision 778), the operation returns to operation 772.

If the system detects a condition to move second data to the NAND media and/or the HDD media (decision 784), the system writes the second data from the fast cache media to the NAND media or from the NAND media to the HDD media (operation 786). If the system does not detect a condition to move the second data to the NAND or HDD media, the operation returns to operation 772.

Figure 8A:
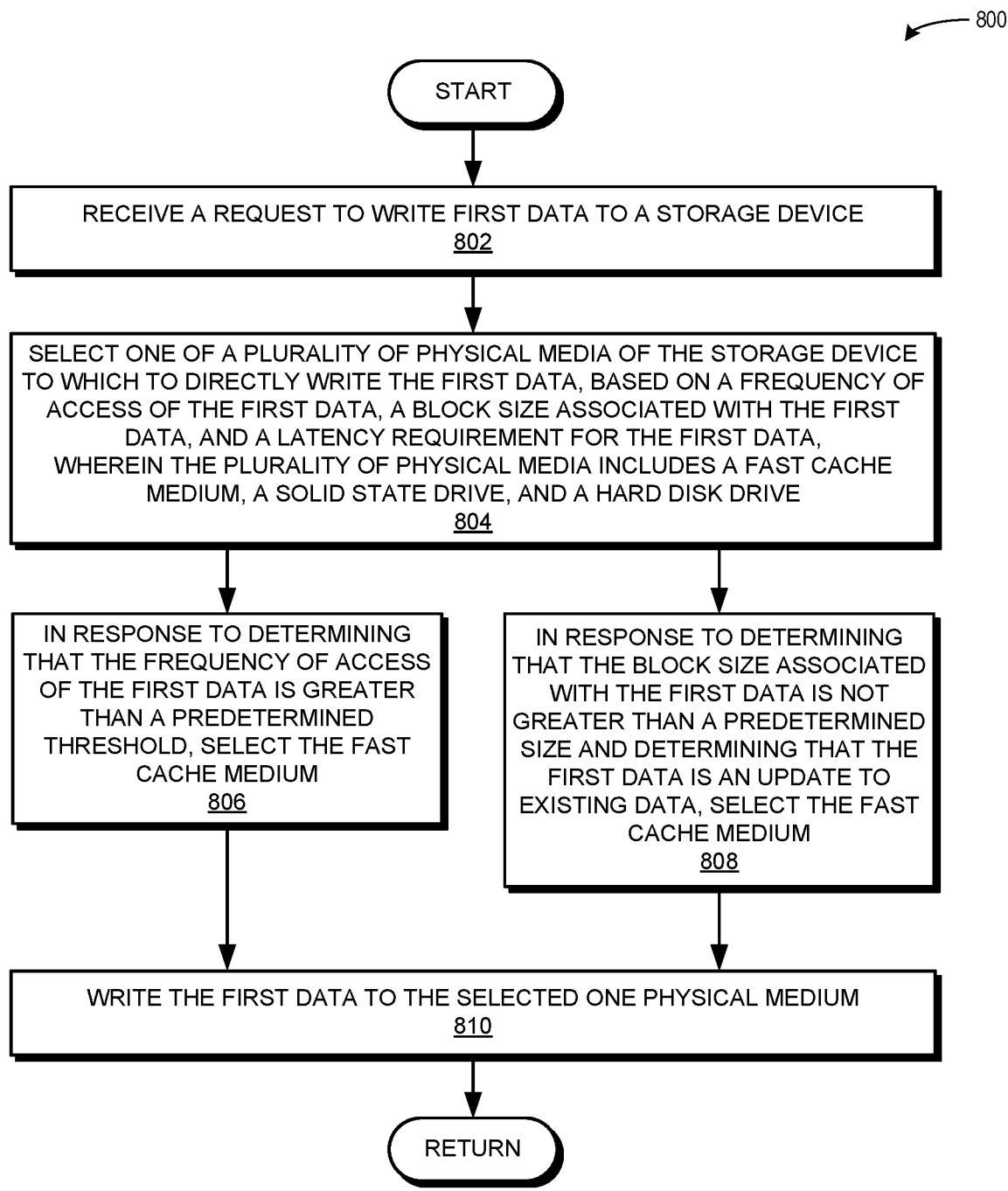
FIG. 8A presents a flowchart illustrating a method for facilitating global data placement in a storage device, in accordance with an embodiment of the present application.

FIG. 8A presents a flowchart 800 illustrating a method for facilitating global data placement in a storage device, in accordance with an embodiment of the present application. During operation, the system receives a request to write first data to a storage device (operation 802). The request can be sent by a host, and received by a storage server or storage system. The system selects one of a plurality of physical media of the storage device to which to directly write the first data, based on a frequency of access of the first data, a block size associated with the first data, and a latency requirement for the first data, wherein the plurality of physical media includes a fast cache medium, a solid state drive, and a hard disk drive (operation 804). In response to determining that the frequency of access of the first data is greater than a predetermined threshold, the system selects the fast cache medium (operation 806). In response to determining that the block size associated with the first data is not greater than a predetermined size and determining that the first data is an update to existing data, the system selects the fast cache medium (operation 808). The system writes the first data to the selected one physical medium (operation 810).

Figure 8B:
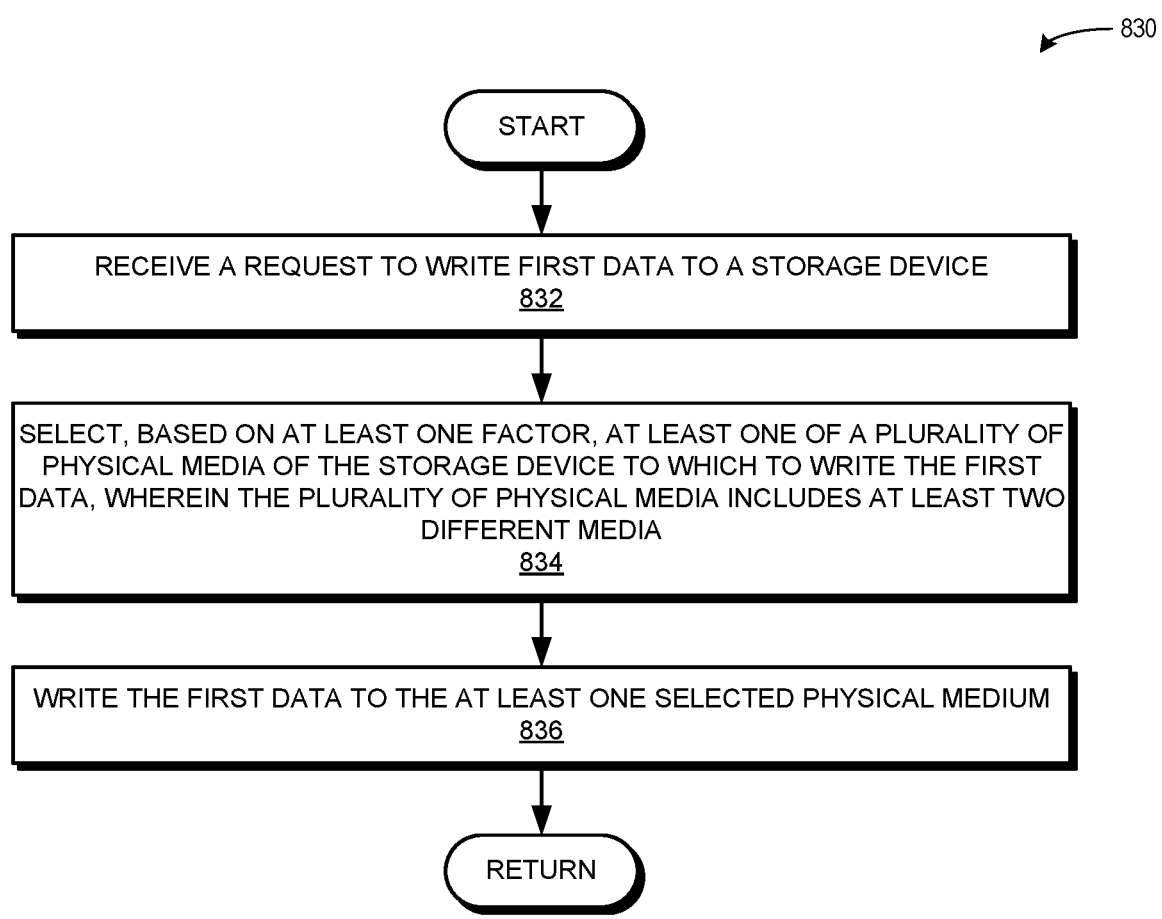
FIG. 8B presents a flowchart illustrating a method for facilitating global data placement in a storage device, in accordance with an embodiment of the present application.

FIG. 8B presents a flowchart 830 illustrating a method for facilitating global data placement in a storage device, in accordance with an embodiment of the present application. During operation, the system receives a request to write first data to a storage device (operation 832). The system selects, based on at least one factor, at least one of a plurality of physical media of the storage device to which to write the first data, wherein the plurality of physical media includes at least two different media (operation 834). The system writes the first data to the at least one selected physical medium (operation 836).

Exemplary Computer System and Apparatus

Figure 9:
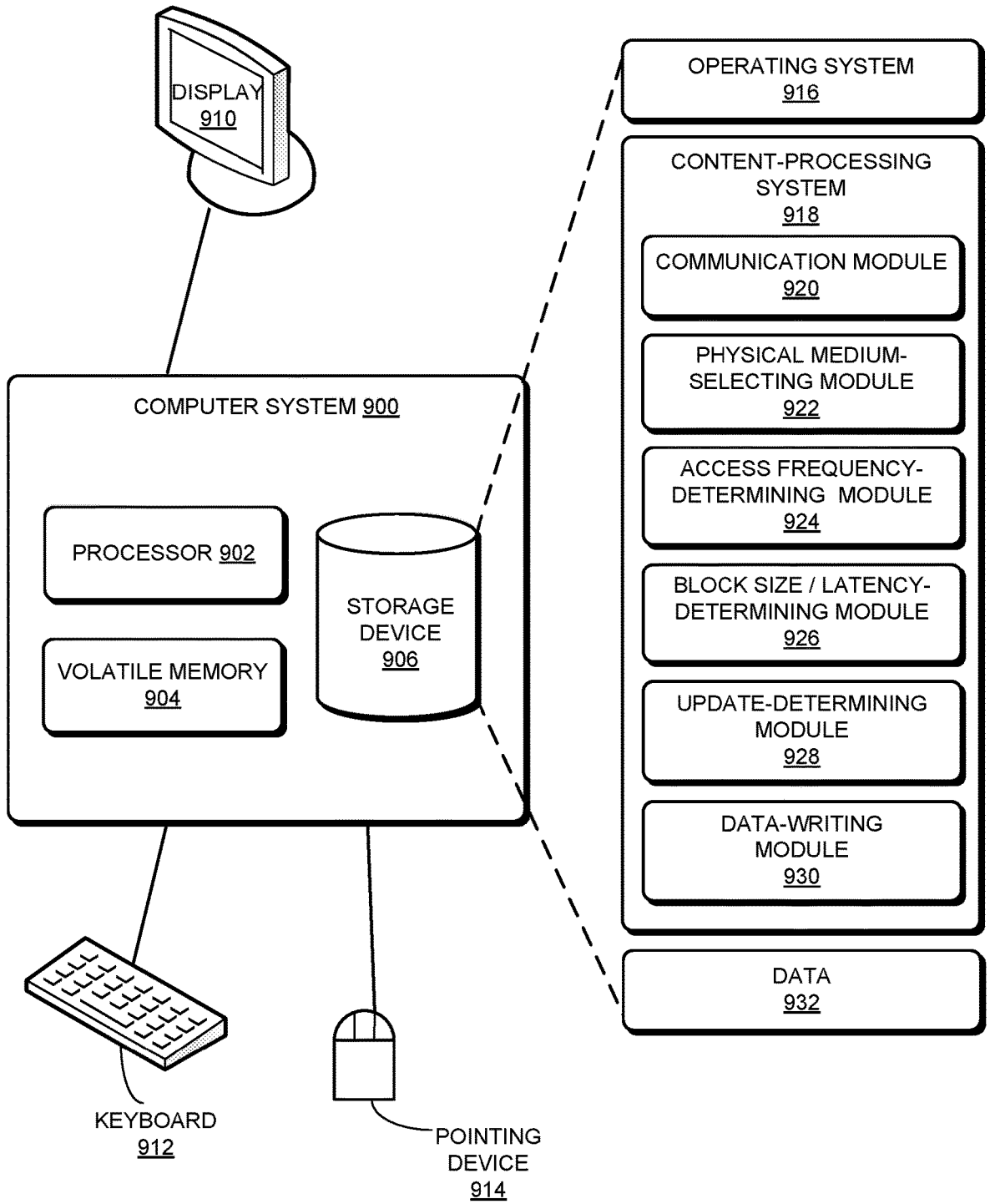
FIG. 9 illustrates an exemplary computer system that facilitates measurement of the performance of a storage device, in accordance with an embodiment of the present application.

FIG. 9 illustrates an exemplary computer system that facilitates measurement of the performance of a storage device, in accordance with an embodiment of the present application. Computer system 900 includes a processor 902, a volatile memory 904, and a storage device 906. Computer system 900 may be a computing device or a storage device. Volatile memory 904 can include memory (e.g., RAM) that serves as a managed memory, and can be used to store one or more memory pools. Computer system 900 can be coupled to a display device 910, a keyboard 912, and a pointing device 914. Storage device 906 can store an operating system 916, a content-processing system 918, and data 932.

Content-processing system 918 can include instructions, which when executed by computer system 900, can cause computer system 900 to perform methods and/or processes described in this disclosure. For example, content-processing system 918 can include instructions for receiving and transmitting data packets, including a request to read or write data, an I/O request, data to be retrieved, encoded, aligned, and stored, or a block or a page of data.

Content-processing system 918 can further include instructions for receiving a request to write first data to the storage device (communication module 920). Content-processing system 918 can include instructions for selecting one of a plurality of physical media of the storage device to which to directly write the first data, based on a frequency of access of the first data, a block size associated with the first data, and a latency requirement for the first data (physical medium-selecting module 922). Content-processing system 918 can include instructions for, in response to determining that the frequency of access of the first data is greater than a predetermined threshold (access frequency-determining module 924), selecting the fast cache medium (physical medium-selecting module 922). Content-processing system 918 can further include instructions for, in response to determining that the block size associated with the first data is not greater than a predetermined size (block size and latency-determining module 926) and determining that the first data is an update to existing data (update-determining module 928), selecting the fast cache medium (physical medium-selecting module 922). Content-processing system 918 can further include instructions for writing the first data to the selected one physical medium (data-writing module 930).

Data 932 can include any data that is required as input or that is generated as output by the methods and/or processes described in this disclosure. Specifically, data 932 can store at least: data to be stored, written, loaded, moved, retrieved, accessed, deleted, encoded, recycled, refreshed, or copied; a frequency of access of data; a block size associated with data; a latency requirement for data; whether data is an update to existing data; an indicator of a fast cache, NAND media, or HDD media; a predetermined threshold (e.g., relating to an access frequency); a predetermined size (e.g., relating to a block size); a predetermined level (e.g., relating to a latency requirement); a physical page of data; a FIFO protocol; merged data; parity information; an error correction code (ECC); an ECC codeword of data; an incremental ECC codeword; a track or a zone of data; a NAND data buffer; an HDD data buffer; an indicator of a specific NAND media; an indicator of a specific track or zone of a specific HDD media; encoded data; aligned data; a data portion; a parity portion; a difference; an incremental parity; hot, warm, or cold data; an indicator of hot, warm, or cold data; and data marked as old or to be recycled.

Figure 10:
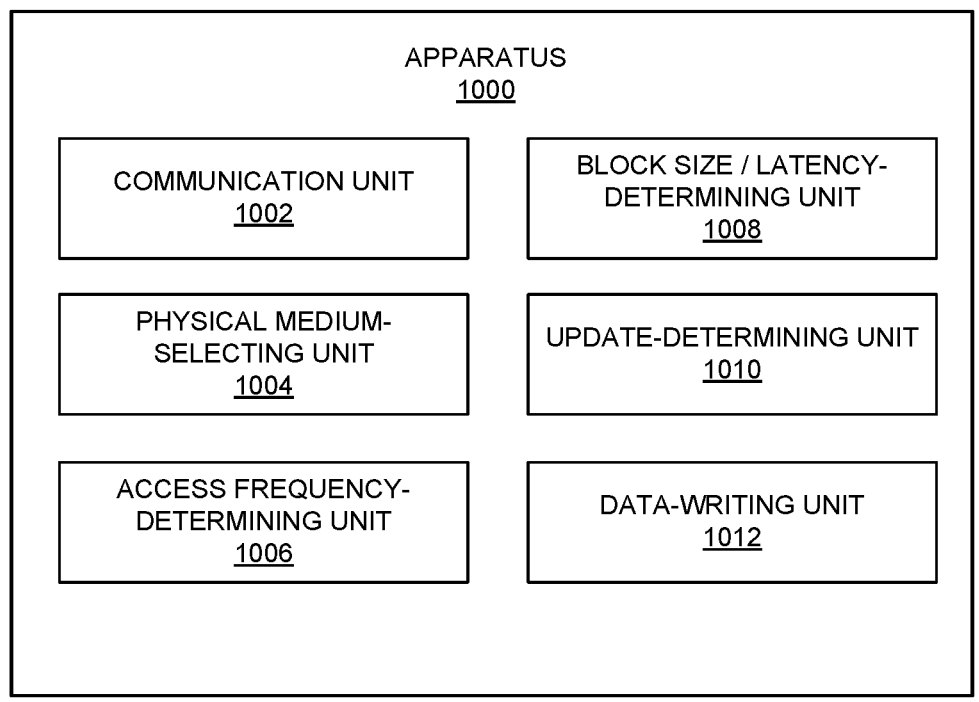
FIG. 10 illustrates an exemplary apparatus that facilitates measurement of the performance of a storage device, in accordance with an embodiment of the present application.

FIG. 10 illustrates an exemplary apparatus 1000 that facilitates measurement of the performance of a storage device, in accordance with an embodiment of the present application. Apparatus 1000 can comprise a plurality of units or apparatuses which may communicate with one another via a wired, wireless, quantum light, or electrical communication channel. Apparatus 1000 may be realized using one or more integrated circuits, and may include fewer or more units or apparatuses than those shown in FIG. 10. Further, apparatus 1000 may be integrated in a computer system, or realized as a separate device which is capable of communicating with other computer systems and/or devices. Specifically, apparatus 1000 can comprise units 1002-1012 which perform functions or operations similar to modules 920-930 of computer system 900 of FIG. 9, including: a communication unit 1002; a physical medium-selecting unit 1004; an access frequency-determining unit 1006; a block size/latency-determining unit 1008; an update-determining unit 1010; and a data-writing unit 1012.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

The foregoing embodiments described herein have been presented for purposes of illustration and description only. They are not intended to be exhaustive or to limit the embodiments described herein to the forms disclosed. Accordingly, many modifications and variations will be apparent to practitioners skilled in the art. Additionally, the above disclosure is not intended to limit the embodiments described herein. The scope of the embodiments described herein is defined by the appended claims.

What is claimed is:

1. A computer-implemented method for facilitating global data placement in a storage device, the method comprising:
   receiving a request to write first data to the storage device;
   selecting, based on at least one factor, at least one of a plurality of physical media of the storage device to which to write the first data,
   wherein the at least one factor includes a block size associated with the first data and a latency requirement for the first data,
   wherein the plurality of physical media includes at least a fast cache medium and a solid state drive, and
   wherein selecting the at least one physical medium involves:
      in response to determining that the block size associated with the first data is greater than a predetermined size, and determining that the latency requirement is greater than a predetermined level, selecting the solid state drive; and
   writing the first data to the at least one selected physical medium.

2. The method of claim 1,
   wherein the at least one factor further includes:
      a frequency of access of the first data;
   wherein the plurality of physical media further includes a hard disk drive; and
   wherein selecting the at least one physical medium further involves:
      in response to determining that the frequency of access of the first data is greater than a predetermined threshold, selecting the fast cache medium; and
      in response to determining that the block size associated with the first data is not greater than the predetermined size and determining that the first data is an update to existing data, selecting the fast cache medium.

3. The method of claim 1, wherein selecting the at least one physical medium further involves:
   in response to determining that the block size associated with the first data is not greater than the predetermined size and determining that the first data is not an update to the existing data, selecting the solid state drive; and
   wherein writing the first data to the solid state drive involves:
      merging the first data to a physical page based on a first-in-first-out protocol; and
      in response to determining that the physical page is full, sequentially writing the merged data and remaining data in the physical page to Not-And (NAND) storage of the solid state drive.

4. The method of claim 1, wherein selecting the at least one physical medium further involves:
   in response to determining that the block size associated with the first data is not greater than the predetermined size and determining that the first data is an update to existing data, and further in response to determining that a last version of the first data is cached in the fast cache medium, the method further comprises:
      determining, in the fast cache medium, a data portion at a first physical location and an associated parity portion at a second physical location, wherein the data portion includes the last version which correspond to the first data;
      reading out the last version from the fast cache medium;
      replacing the last version with the first data to obtain a new version of the data portion; and
      encoding the new version to obtain a new parity,
   wherein writing the first data to the selected fast cache medium further involves writing the new version and the new parity to the fast cache medium at, respectively, the first physical location and the second physical location.

5. The method of claim 1, wherein selecting the at least one physical medium further involves:
   in response to determining that the block size associated with the first data is not greater than the predetermined size and determining that the first data is an update to existing data, and further in response to determining that a last version of the first data is not cached in the fast cache medium, the method further comprises:
  reading out a user portion from Not-And (NAND) storage of the solid state drive, wherein the user portion includes the last version which corresponds to the first data;
  comparing the user portion with the first data to obtain a first difference;
  aligning the first difference; and
  encoding the aligned first difference to obtain an incremental parity,
  wherein writing the first data to the selected fast cache medium further involves writing an incremental ECC codeword which includes the aligned first difference and the incremental parity.

6. The method of claim 2, further comprising detecting a condition to move data from the fast cache medium to the solid state drive or a condition to move data from the solid state drive to the hard disk drive, which involves one or more of:
  in response to identifying warm or cold data in the fast cache medium, writing the warm or cold data from the fast cache medium to Not-And (NAND) storage of the solid state drive;
  in response to recycling data which is marked as old in the NAND storage of the solid state drive:
    retrieving a most recent version of corresponding data in the fast cache medium; and
    writing the most recent version from the fast cache medium to the NAND storage of the solid state drive; and
  in response to triggering a garbage collection, recycling, or other process which requires moving a second set of data from the fast cache medium to the NAND storage of the solid state drive or from the NAND storage of the solid state drive to the hard disk drive, writing the second set of data from the fast cache medium to the NAND storage of the solid state drive or from the NAND storage of the solid state drive to the hard disk drive.

7. The method of claim 2, wherein selecting the at least one physical medium further involves:
  in response to determining that the frequency of access of the first data is not greater than the predetermined threshold, determining that the block size associated with the first data is greater than the predetermined size, and determining that the latency requirement is not greater than the predetermined level:
    selecting the hard disk drive.

8. The method of claim 1,
  wherein writing the first data to the solid state drive involves writing the first data simultaneously over multiple Not-And (NAND) channels to NAND storage of the solid state drive.

9. A computer system for facilitating global data placement in a storage device, the system comprising:
  a processor; and
  a memory coupled to the processor and storing instructions, which when executed by the processor cause the processor to perform a method, wherein the computer system is the storage device, the method comprising:
    receiving a request to write first data to the storage device;
    selecting, based on at least one factor, at least one of a plurality of physical media of the storage device to which to write the first data,
    wherein the at least one factor includes a block size associated with the first data and a latency requirement for the first data,
    wherein the plurality of physical media includes at least a fast cache medium and a solid state drive, and
    wherein selecting the at least one physical medium involves:
      in response to determining that the block size associated with the first data is greater than a predetermined size, and determining that the latency requirement is greater than a predetermined level, selecting the solid state drive; and
    writing the first data to the at least one selected physical medium.

10. The computer system of claim 9,
  wherein the at least one factor further includes:
    a frequency of access of the first data;
  wherein the plurality of physical media further includes a hard disk drive; and
  wherein selecting the at least one physical medium further involves:
    in response to determining that the frequency of access of the first data is greater than a predetermined threshold, selecting the fast cache medium; and
    in response to determining that the block size associated with the first data is not greater than the predetermined size and determining that the first data is an update to existing data, selecting the fast cache medium.

11. The computer system of claim 9, wherein selecting the at least one physical medium further involves:
  in response to determining that the block size associated with the first data is not greater than the predetermined size and determining that the first data is not an update to the existing data, selecting the solid state drive; and
  wherein writing the first data to the solid state drive involves:
    merging the first data to a physical page based on a first-in-first-out protocol; and
    in response to determining that the physical page is full, sequentially writing the merged data and remaining data in the physical page to Not-And (NAND) storage of the solid state drive.

12. The computer system of claim 10, wherein selecting the at least one physical medium further involves:
  in response to determining that the block size associated with the first data is not greater than the predetermined size and determining that the first data is an update to existing data, and further in response to determining that a last version of the first data is cached in the fast cache medium, the method further comprises:
    determining, in the fast cache medium, a data portion at a first physical location and an associated parity portion at a second physical location, wherein the data portion includes the last version which correspond to the first data;
    reading out the last version from the fast cache medium;
    replacing the last version with the first data to obtain a new version of the data portion; and
    encoding the new version to obtain a new parity,
  wherein writing the first data to the selected fast cache medium further involves writing the new version and the new parity to the fast cache medium at, respectively, the first physical location and the second physical location.

13. The computer system of claim 9, wherein selecting the at least one physical medium further involves:
in response to determining that the block size associated with the first data is not greater than the predetermined size and determining that the first data is an update to existing data, and further in response to determining that a last version of the first data is not cached in the fast cache medium, the method further comprises:
reading out a user portion from Not-And (NAND) storage of the solid state drive, wherein the user portion includes the last version which corresponds to the first data;
comparing the user portion with the first data to obtain a first difference;
aligning the first difference; and
encoding the aligned first difference to obtain an incremental parity,
wherein writing the first data to the selected fast cache medium further involves writing an incremental ECC codeword which includes the aligned first difference and the incremental parity.

14. The computer system of claim 10, wherein the method further comprises detecting a condition to move data from the fast cache medium to the solid state drive or a condition to move data from the solid state drive to the hard disk drive, which involves one or more of:
in response to identifying warm or cold data in the fast cache medium, writing the warm or cold data from the fast cache medium to Not-And (NAND) storage of the solid state drive;
in response to recycling data which is marked as old in the NAND storage of the solid state drive:
retrieving a most recent version of corresponding data in the fast cache medium; and
writing the most recent version from the fast cache medium to the NAND storage of the solid state drive; and
in response to triggering a garbage collection, recycling, or other process which requires moving a second set of data from the fast cache medium to the NAND storage of the solid state drive or from the NAND storage of the solid state drive to the hard disk drive, writing the second set of data from the fast cache medium to the NAND storage of the solid state drive or from the NAND storage of the solid state drive to the hard disk drive.

15. The computer system of claim 10, wherein selecting the at least one physical medium further involves:
in response to determining that the frequency of access of the first data is not greater than the predetermined threshold, determining that the block size associated with the first data is greater than the predetermined size, and determining that the latency requirement is not greater than the predetermined level:
selecting the hard disk drive.

16. The computer system of claim 9,
wherein writing the first data to the solid state drive involves writing the first data simultaneously over multiple Not-And (NAND) channels to NAND storage of the solid state drive.

17. A non-transitory computer-readable storage medium storing instructions that when executed by a computer cause the computer to perform a method, the method comprising:
receiving a request to write first data to a storage device;
selecting, based on at least one factor, at least one of a plurality of physical media of the storage device to which to write the first data,
wherein the at least one factor includes a block size associated with the first data and a latency requirement for the first data,
wherein the plurality of physical media includes at least a fast cache medium and a solid state drive, and
wherein selecting the at least one physical medium involves:
in response to determining that the block size associated with the first data is greater than a predetermined size, and determining that the latency requirement is greater than a predetermined level, selecting the solid state drive; and
writing the first data to the at least one selected physical medium.

18. The storage medium system of claim 17,
wherein the at least one factor further includes:
a frequency of access of the first data;
wherein the plurality of physical media further includes a hard disk drive; and
wherein selecting the at least one physical medium further involves:
in response to determining that the frequency of access of the first data is greater than a predetermined threshold, selecting the fast cache medium; and
in response to determining that the block size associated with the first data is not greater than the predetermined size and determining that the first data is an update to existing data, selecting the fast cache medium.

19. The storage medium of claim 17, wherein selecting the at least one physical medium further involves:
in response to determining that the block size associated with the first data is not greater than the predetermined size and determining that the first data is not an update to the existing data, selecting the solid state drive; and
wherein writing the first data to the solid state drive involves:
merging the first data to a physical page based on a first-in-first-out protocol; and
in response to determining that the physical page is full, sequentially writing the merged data and remaining data in the physical page to Not-And (NAND) storage of the solid state drive.

20. The storage medium of claim 17, wherein selecting the at least one physical medium further involves:
in response to determining that the block size associated with the first data is not greater than the predetermined size and determining that the first data is an update to existing data, and further in response to determining that a last version of the first data is cached in the fast cache medium, the method further comprises:
determining, in the fast cache medium, a data portion at a first physical location and an associated parity portion at a second physical location, wherein the data portion includes the last version which correspond to the first data;
reading out the last version from the fast cache medium;
replacing the last version with the first data to obtain a new version of the data portion; and
encoding the new version to obtain a new parity,
wherein writing the first data to the selected fast cache medium further involves writing the new version and the new parity to the fast cache medium at, respectively, the first physical location and the second physical location; and in response to determining that the block size associated with the first data is not greater than the predetermined size and determining that the first data is an update to existing data, and further in response to determining that a last version of the first data is not cached in the fast cache medium, the method further comprises:
  reading out a user portion from Not-And (NAND) storage of the solid state drive, wherein the user portion includes the last version which corresponds to the first data;
  comparing the user portion with the first data to obtain a first difference;
  aligning the first difference; and
  encoding the aligned first difference to obtain an incremental parity,
wherein writing the first data to the selected fast cache medium further involves writing an incremental ECC codeword which includes the aligned first difference and the incremental parity.

* * * * *